US012713528B2

(12) United States Patent
Schmitt

(10) Patent No.: US 12,713,528 B2
(45) Date of Patent: Aug. 18, 2026

(54) DEVICE FOR THERMAL CONDUCTION AND ELECTRICAL ISOLATION

(71) Applicant: Nitride Global Inc., Wichita, KS (US)

(72) Inventor: Jason Schmitt, Wichita, KS (US)

(73) Assignee: Nitride Global Inc., Wichita, KS (US)

( * ) Notice: Subject to any disclaimer, the term of this patent is extended or adjusted under 35 U.S.C. 154(b) by 210 days.

(21) Appl. No.: 18/388,737

(22) Filed: Nov. 10, 2023

(65) Prior Publication Data

US 2024/0121895 A1 Apr. 11, 2024

Related U.S. Application Data

(62) Division of application No. 16/605,079, filed as application No. PCT/US2018/027641 on Apr. 13, 2018, now abandoned.

(60) Provisional application No. 62/485,202, filed on Apr. 13, 2017.

(51) Int. Cl.

| | |
|---|---|
| ***H05K 1/00*** | (2006.01) |
| ***B32B 15/16*** | (2006.01) |
| ***H05K 1/05*** | (2006.01) |
| ***H10W 70/68*** | (2026.01) |

(52) U.S. Cl.

CPC ............. *H05K 1/053* (2013.01); *B32B 15/16* (2013.01); *H10W 70/6875* (2026.01); *H10W 70/682* (2026.01)

(58) Field of Classification Search

CPC ....... H05K 1/053; B32B 15/16; H01L 23/142; H01L 2924/13055; H01L 2924/15153; H01L 2224/48227; H01L 23/3731; H01L 23/3735

USPC .......................................................... 216/94

See application file for complete search history.

(56) References Cited

U.S. PATENT DOCUMENTS

| | | | | |
|---|---|---|---|---|
| 5,643,834 A * | 7/1997 | Harada | ................. | H01L 23/142 257/E23.056 |
| 10,134,666 B2 * | 11/2018 | Park | .................. | H01L 23/49822 |
| 2014/0377522 A1 * | 12/2014 | Koch, III | ............ | C03C 17/3435 428/428 |

FOREIGN PATENT DOCUMENTS

| | | | | |
|---|---|---|---|---|
| WO | WO-2006005067 A2 * | 1/2006 | ............. | C04B 41/52 |

* cited by examiner

*Primary Examiner* — Duy Vu N Deo

(74) *Attorney, Agent, or Firm* — Polsinelli PC

(57) ABSTRACT

The disclosure provides an insulated metal substrate (IMS) including a substrate having a first side and a second side. The IMS may also include a first dielectric layer on the first side of the substrate. The dielectric layer may include a metal-based oxynitride and/or a metalloid-based oxynitride layer, oxygen is from 0.1 at % to 49.9 at %, nitrogen is from 0.1 at % to 49.9 at % and a sum of oxygen and nitrogen is about 50 at %. The first dielectric layer comprises a material selected from a group consisting of aluminum oxynitride (AlON), aluminum oxyhydronitride (AlHON), aluminum oxycarbonitride (AlCON), SiGeON, GaON, SiON, and GeON. The substrate comprises one of Cu, Al, AlSi, C—Al, W—Cu, or Ti.

30 Claims, 13 Drawing Sheets

100A
2
1

100B
2
1
2

100C
4
3

100D
5
3

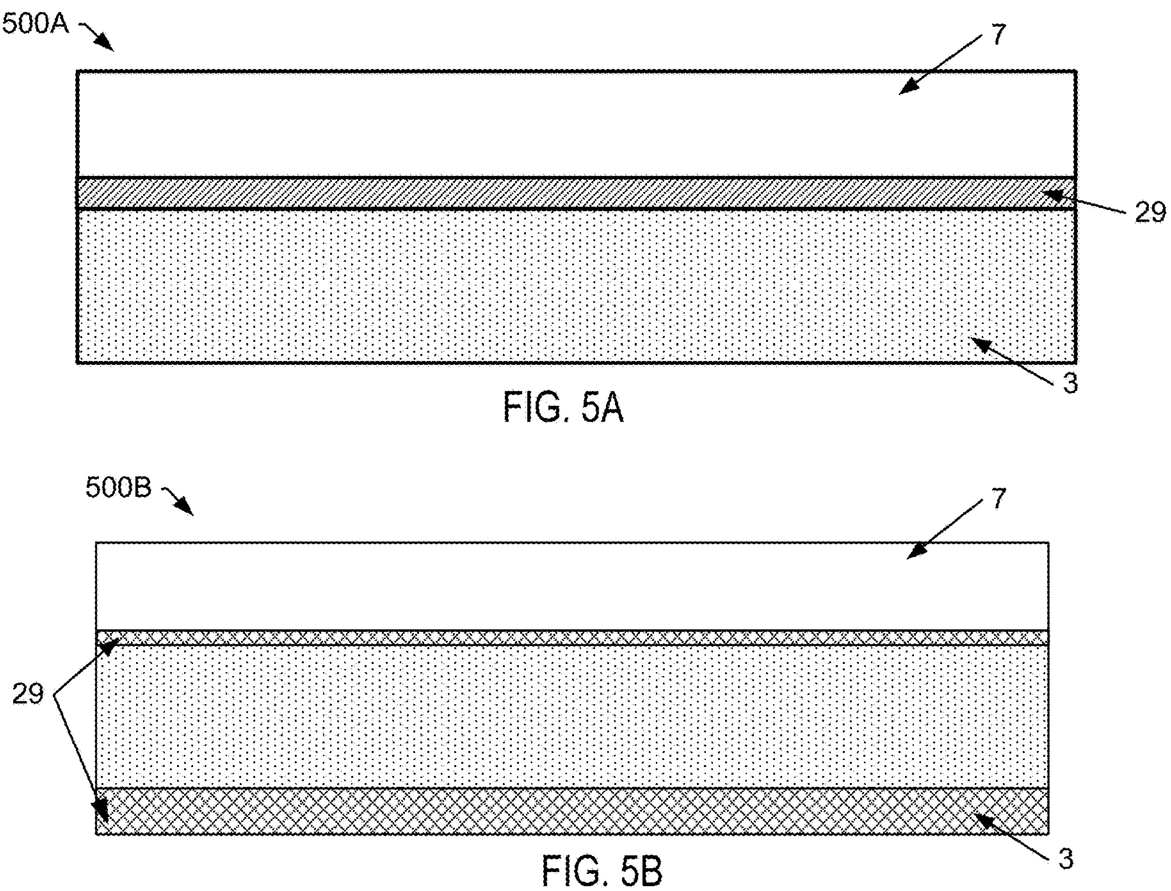
FIG. 5A
FIG. 5B
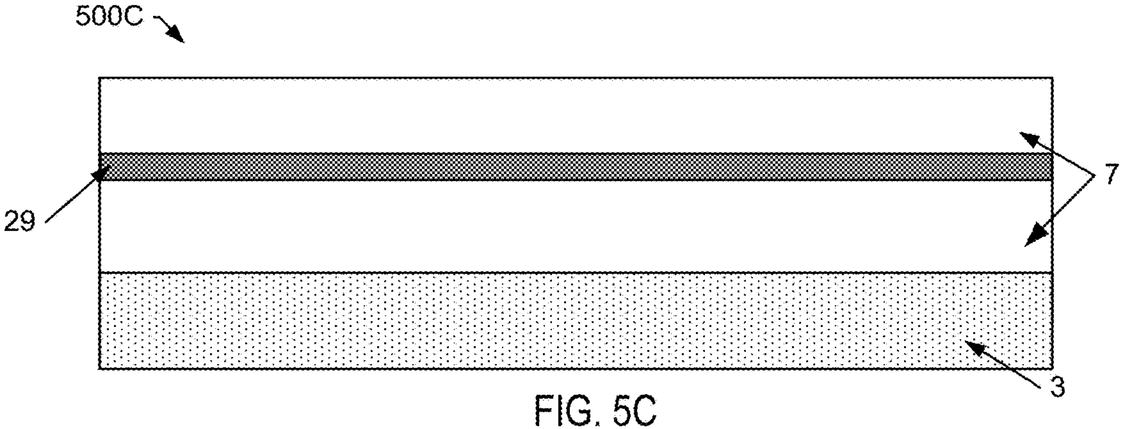
FIG. 5C

DEVICE FOR THERMAL CONDUCTION AND ELECTRICAL ISOLATION

CROSS-REFERENCE TO RELATED PATENT APPLICATION

This patent application is a divisional application of U.S. patent application Ser. No. 16/605,079, filed Oct. 14, 2019 which is a national stage entry of PCT Application No. PCT/US18/27641, filed Apr. 13, 2018 that claims the benefit under 35 U.S.C. § 119(e) of U.S. Patent Application No. 62/485,202, entitled "DEVICE FOR THERMAL CONDUCTION AND ELECTRICAL ISOLATION," filed on Apr. 13, 2017, which are incorporated herein by reference in their entirety.

FIELD

The disclosure is directed to a device including an insulated metal substrate (IMS) and a core-metal-substrate and methods for fabricating the device.

BACKGROUND

Ceramic core substrate devices (herein "CCS devices") are currently industry leading devices for thermal management in electronic devices. For the CCS devices to function as mechanical supports for electronic devices, they should provide reasonably high thermal conductivity and reasonably high electrical insulation. Typically, the ceramic core substrate is thicker than the attached metal layer. CCS devices may have one or multiple layers of ceramic core substrates and attached-metal layers. Most common is a single attached metal layer or "front side metal" configuration.

Further CCS devices are comprised of two types. In one aspect, these types of CCS devices are differentiated by how the metal layer is attached to the ceramic core substrate. The attachment process includes direct plating or direct bonding. In these two attachment methods, copper is the preferred metal for the attached metal layer. Thus, the resulting CCS devices may be referred to as either direct plated copper ("DPC") or direct bonded copper ("DBC"), herein referred to collectively as "DPC/DBC". Similarly, three other types of ceramic core substrate are used in CCS devices: an alumina ceramic core substrate, an aluminum nitride (AlN) ceramic core substrate, and a beryllium oxide (BeO) ceramic core substrate.

Alumina CCS devices substrates have been developed and used because of their reduced cost and toxicity when compared to BeO CCS devices. AlN CCS devices substrates have been developed and used because of their higher thermal conductivity in comparison to alumina CCS device substrates. For the DBC process, the ceramic core substrate (e.g. alumina, AlN or BeO) acts as the supporting body for the CCS devices, and is then bonded to a thin layer of copper. This is done at the surface of ceramic core substrate by using Cu—O eutectic layer as a joint interface. The Cu—O eutectic layer is formed by the reaction of a small amount of oxygen with copper at high temperature above 800° C. While the production of AlN and alumina DPC/DBC CCS devices is an industrial process, as disclosed in U.S. Patent Publication No. 2009/0152237 and U.S. Pat. No. 6,800,211B2, problems do arise. Fracture of ceramic due to generating of thermal stress in 1) manufacturing process by difference of the thermal expansion coefficient between ceramic and metal and 2) delayed fracture of ceramic due to thermal cycle stress under practical service conditions are real problems in the longevity and performance of these DPC/DBC CCS devices. This is illustrated in "Thermal Performance and reliability of bonded interfaces for power electronics packaging," ASTR 2011 (NREL/PR-5400-52468), a report from NREL.

An insulated metal substrate (IMS) includes Al core-metal-substrate with an alumina ($Al_2O_3$) deposited-dielectric layer. Few deposited-dielectric layers provide both high thermal conductivity and high electrical insulation. Two dominant types of deposited-dielectric layers tried are alumina and AlN.

The first deposited-dielectric layer, i.e. alumina layer, has a poor thermal performance (1-30 W/mK), but is easy to produce using oxidation on an aluminum core-metal-substrate. This method work well when the core-metal-substrate is aluminum, but cannot be translated to other high thermal conductivity metals such as copper, steel, nickel, and other high temperature metals such as titanium, tungsten, and molybdenum. Also, the alumina layer is very thin, for example, a few tens of microns. Furthermore, alumina's low thermal conductivity has an impact on the performance of the IMS. As disclosed in U.S. Patent Publication No. 20140293554 A1, "it may be advantageous, therefore, that the coating of an IMS according to any aspect of the disclosure has a thermal conductivity of greater than 4 or 5 W/mK, for example, between 4 and 15 W/mK. Preferably, the thermal conductivity is between 5 and 14 W/mK". Alumina may be unable to provide a thermal conductivity over approximately 23-30 W/mK, which is the value for the single crystalline form of alumina, i.e. sapphire.

A fully densified deposited-dielectric layer of alumina is nearly impossible. Pin holes may be produced, which leads to low yield production. This issue is disclosed in U.S. Pat. No. 9,551,082 B2 as follows: "in preferred embodiments, the coating has porosity, and pores defined in a surface of the non-metallic coating have an average size or average diameter of less than 500 nanometers". This porosity leads to problems with low dielectric strength (electrical insulation) as defined in U.S. Pat. No. 9,551,082 B2. For example, U.S. Pat. No. 9,551,082 B2, discloses "for IMS applications, the dielectric strength of a coating is of particular importance. The coating of an IMS according to any aspect of the present disclosure may, advantageously, provide a dielectric strength of between 50 and 120 kV/mm. Preferably, the coating provides a dielectric strength in the range of 60 to 100 kV/mm" and also "the dielectric strength is between 50 and 120 kV/mm, and the thermal conductivity is between 5 and 14 W/mK" in the claims.

The following patent publications or patents, WO 2012034752 A1, DE 102010045783 A1, CA2819313A1, CA2824541A1, CN103339297A, CN103339298A, EP2673402A2, EP2673403A1, US20160186352, WO2012107754A2, WO2012107754A3, WO2012107754A9, U.S. Pat. No. 9,551,082 B2, and WO2012107755A1, describe various methods providing an alumina coating on an aluminum substrate.

Further problems arise with the selectivity of the application of the deposited-dielectric layer. It is cumbersome to take the steps to ensure that deposited-dielectric layer does not cover the back and sides of the aluminum metal support substrate. The state of the art alumina deposited-dielectric layer on core-metal-substrates leaves much room for improvement from the standpoint of thermal conductivity (W/mK), dielectric strength (kV/mm) and compatibility to thermal strains.

The second IMS deposited-dielectric layer, i.e. AlN layer, has a high thermal conductivity and a high dielectric constant that translates to a good electrical insulation. Yet, despite its high dielectric constants, it is difficult to produce an AlN deposited-dielectric layer with acceptable electrical insulation for an IMS. This stems from the highly columnar nature of AlN growth using current deposition techniques.

Another issue arises in any IMS deposited-dielectric layer. There is a problem with enhanced adhesion of the subsequent metal layers needed to make a fully assembled IMS board for electrical devices. These subsequent metal layers, can involve Cu as thick as 150 μm, have added adhesion problems and require complex additional steps to bond to the IMS deposited-dielectric layer without delamination.

BRIEF SUMMARY

The disclosure provides an IMS including a metal-oxynitride film on a substrate with enhanced adhesion. The disclosure also provides an IMS system including the metal-oxynitride film for providing thermal conduction and electrical isolation.

In an embodiment, an insulated metal substrate (IMS) may include a substrate having a first side and a second side. The IMS may also include a first dielectric layer on the first side of the substrate. The dielectric layer may include a metal-based oxynitride and/or a metalloid-based oxynitride layer, oxygen is from 0.1 atomic (at) % to 49.9 at %, nitrogen is from 0.1 at % to 49.9 at % and a sum of oxygen and nitrogen is about 50 at %.

In an embodiment, the metal-based oxynitride may include $A_xO_yN_z$, where A stands for a metal, y is from 0.1 at % to 49.9 at %, z is from 0.1 at % to 49.9 at % and y+z is about 50 at %.

In an embodiment, the metalloid-based oxynitride includes $B_xO_yN_z$, wherein B stands for a metalloid, y is from 0.1 at % to 49.9 at %, z is from 0.1 at % to 49.9 at % and y+z is about 50 at %.

In an embodiment, the dielectric layer includes one or more elements.

In an embodiment, the first dielectric layer includes a material selected from a group consisting of metal-based oxynitride, group III metals-based oxynitride, Group II metals-based oxynitride, Group IV metalloids-based oxynitrides, oxyhydronitrides, and oxycarbonitrides.

In an embodiment, the first dielectric layer includes a material selected from a group consisting of aluminum oxynitride (AlON), aluminum oxyhydronitride (AlHON), aluminum oxycarbonitride (AlCON), SiGeON, GaON, SiON, and GeON.

In an embodiment, the substrate includes a material selected from a group consisting of metal, metal alloys, composite, and polymer.

In an embodiment, the substrate includes one of Cu, Al, AlSi, C—Al, W—Cu, or Ti or any alloys of these.

In an embodiment, the substrate is in a two-dimensional shape or a three-dimensional shape.

In an embodiment, the substrate includes a finned structure.

In an embodiment, the substrate is pre-stressed.

In an embodiment, the first dielectric layer is disposed over a textured surface of the substrate.

In an embodiment, the first dielectric layer includes a plurality of recesses.

In an embodiment, the IMS may also include a stress reduction metal layer between the substrate and the dielectric layer.

In an embodiment, the IMS may also include a first stress reduction metal layer over a first side of the substrate and a second stress reduction metal layer over a second side of the substrate.

In an embodiment, the IMS may also include a pre-metal-oxynitride adhesion layer over the first dielectric layer.

In an embodiment, the IMS may also include a second dielectric layer covering the sidewalls and/or the bottom of the substrate.

In an embodiment, the first dielectric layer may include alternating first and second dielectric layers.

In an embodiment, the first dielectric layer may include a metal-oxynitride composition gradient.

In an embodiment, the IMS may also include a second dielectric layer over the second side of the substrate.

In an embodiment, the first dielectric layer has a thickness ranging from 50 nm to 500 μm.

In an embodiment, the metal-based oxynitride includes AlON, and the AlON includes a random structure.

In an embodiment, the first dielectric layer has a thermal conductivity of at least 1 W/mk and the electrical standoff voltage greater than 50 v/μm.

In an embodiment, an IMS may include a substrate having a first side and a second side and an oxygen-doped AlN layer including oxygen from 0.0001 to 15 at % on the first side of the substrate.

In an embodiment, an IMS may include a substrate having a first side and a second side and a nitrogen-doped $Al_2O_3$ layer including nitrogen from 0.0001 to 15 at % on the first side of the substrate.

In an embodiment, the first AlN or $Al_2O_3$ layer is disposed over a textured surface of the substrate.

In an embodiment, the AlN or $Al_2O_3$ layer includes a plurality of recesses.

In an embodiment, the IMS may also include a metal layer between the substrate and the AlN layer.

In an embodiment, the AlN or $Al_2O_3$ layer covers the side or the bottom of the substrate.

In an embodiment, the IMS may also include a second AlN or $Al_2O_3$ layer over the second side of the substrate.

In an embodiment, the first AlN or $Al_2O_3$ has a thickness ranging from 50 nm to 500 μm.

In an embodiment, an IMS board may include a subsequent metal layer over the IMS.

In an embodiment, an IMS system may include an electronic device or an acoustical device disposed over the IMS board.

In an embodiment, the electronic device includes one of light-emitting diode (LED), insulated-gate bipolar transistor (IGBT), and transistor.

In an embodiment, the acoustical device includes a piezoelectric transducer.

Additional embodiments and features are set forth in part in the description that follows, and in part will become apparent to those skilled in the art upon examination of the specification, or may be learned by the practice of the embodiments discussed herein. A further understanding of the nature and advantages of certain embodiments may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein:

FIG. 5A depicts an IMS including a metal-oxynitride layer having an intra metal sublayer for stress mitigation according to an embodiment.

FIG. 5B depicts an IMS including a metal-oxynitride layer having a thin intra metal sublayer and a thick extra metal layer for stress mitigation according to an embodiment.

FIG. 5C depicts an IMS including a thin intra metal sublayer between two metal-oxynitride layers for stress mitigation according to an embodiment.

DETAILED DESCRIPTIONS

The disclosure may be understood by reference to the following detailed description, taken in conjunction with the drawings as described below. It is noted that, for purposes of illustrative clarity, certain elements in various drawings may not be drawn to scale.

Figures 1A, 1B, 1C, 1D:
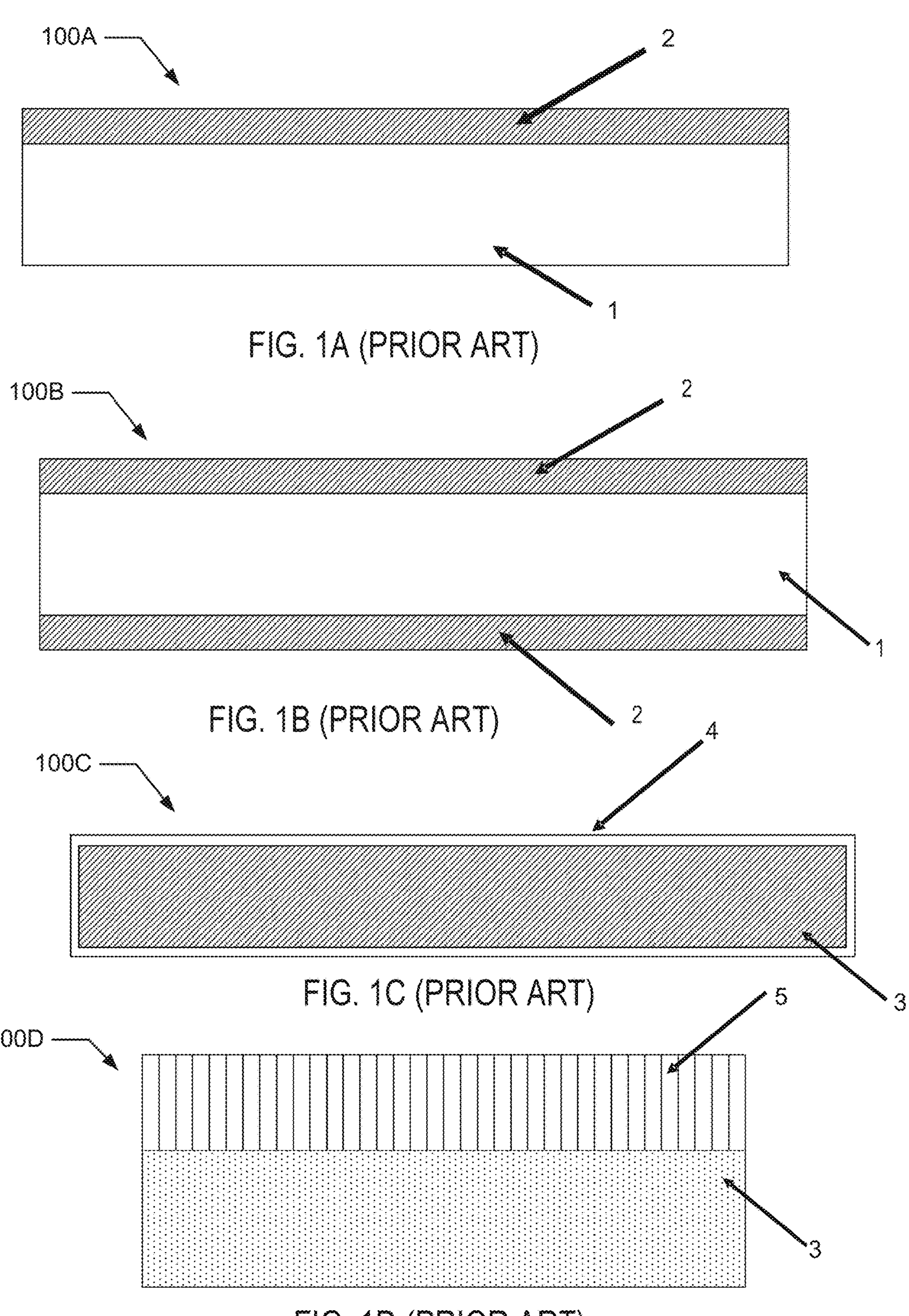
FIG. 1A depicts a ceramic core substrate (CCS) device including a metal layer over a ceramic core substrate (Prior Art).
FIG. 1B depicts a CCS including a metal layer over both sides of a ceramic core substrate (Prior Art).
FIG. 1C depicts an IMS including $Al_2O_3$ deposited-dielectric layer over a ceramic core substrate (Prior Art).
FIG. 1D depicts a columnar structure for AlN over a core-metal-metal substrate (Prior Art).

FIG. 1A depicts a ceramic core substrate (CCS) device including a metal layer over a ceramic core substrate (Prior Art). CCS devices 100A typically include two primary components, a ceramic core substrate 1 as a mechanical support, and at least one attached metal layer 2, as shown in FIG. 1A.

FIG. 1B depicts a CCS including a metal layer over both sides of a ceramic core substrate (Prior Art). As shown, a dual metal layer configuration or "front and back side metal" configuration 100B includes a ceramic core substrate 1 as a mechanical support, and at least one attached metal layer 2.

FIG. 1C depicts an IMS including $Al_2O_3$ deposited-dielectric layer over a ceramic core substrate (Prior Art). As shown, an insulated metal substrate (IMS) 100C includes Al core-metal-substrate 3 with an alumina ($Al_2O_3$) deposited-dielectric layer 4.

FIG. 1D depicts a columnar structure for AlN over a core-metal-metal substrate (Prior Art). As shown in FIG. 1D, columnar AlN deposited-dielectric layer 5 is over a substrate 3. While almost fully densified (in comparison to alumina) the columnar nature of the AlN allows small imperfections to direct pathways to the underlying core-metal-substrate and a pathway to cracking during thermal cycling.

Insulated Metal Substrate (IMS)

Figures 2A, 2B, 3:
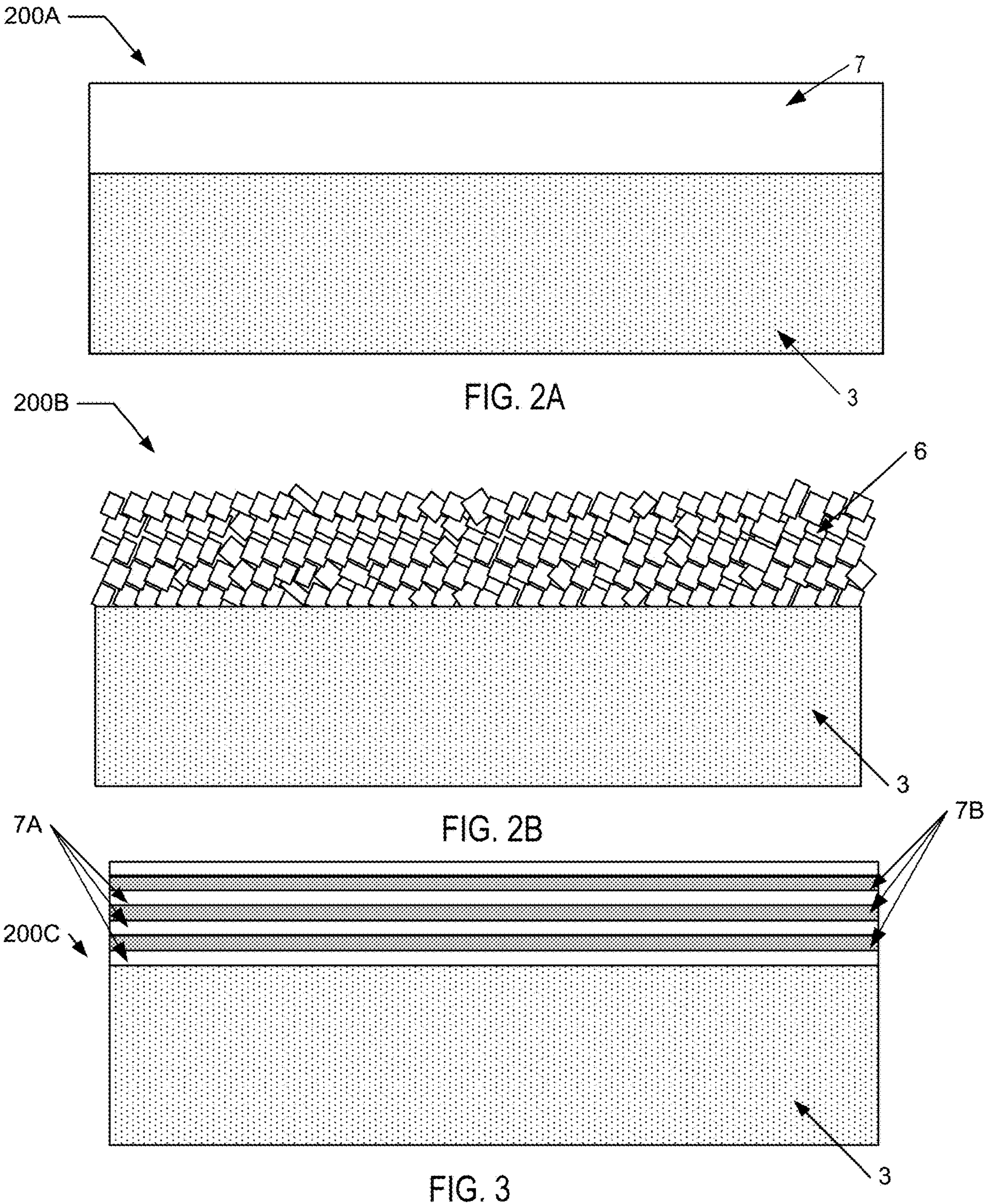
FIG. 2A depicts an IMS including an Al-oxynitride ($Al_xO_yN_z$) film over a substrate according to an embodiment.
FIG. 2B depicts an IMS including randomized $Al_xO_yN_z$ layer over a substrate according to an embodiment.
FIG. 3 depicts an IMS including alternating dielectric layers (e.g. metal oxynitride layers) over a substrate according to an embodiment.

An insulated metal substrate (IMS) can act as a supporting body (or mount) for individual electric devices, acoustical devices, and multi component systems. The IMS provides a potential candidate to displace current DPC and DBC CCS devices substrates as a thermal management system. IMS and DPC/DBC CCS devices are polar opposites. In construction, the present disclosure provides an IMS 200A including a thin deposited-dielectric layer 7 (e.g. metal oxynitride layer or $Al_xO_yN_z$) on a thicker core-metal-substrate 3, as shown in FIG. 2A. For example, the deposited-dielectric layer 7 may be AlON deposited on a substrate 3 (e.g. copper). The substrate 3 may also include tungsten, copper tungsten alloy, polymer, among others.

In contrast, DPC/DBC CCS devices use thinner attached metal layer 2 on thicker ceramic core substrate 1 for dielectric isolation, as shown in FIG. 1A.

The IMS 200A acts as a mechanical supporting body. Also, both high thermal conductivity and high electric insulation are required for the IMS. The IMS materials of construction allow for efficient heat removal while providing adequate electrical isolation. To deliver both the efficient heat removal and adequate electrical isolation, the IMS relies on the thin deposited-dielectric layer. The deposited-dielectric layer must have both a high thermal conductivity and the ability to block applied voltage while being able to bond well to the underlying core-metal-substrate and to bond to additional layers used to attach electronic devices.

The IMS may have high thermal conductivity, high electrical insulation, deposited-dielectric layer to core-metal-substrate bonding, and deposited-dielectric layer to additional dielectric layer bonding.

A solution to both of AlN's issues as a deposited-dielectric layer for the IMS can be found when oxygen is introduced during the production of the deposited-dielectric layer. The introduction of oxygen spans from aluminum nitride doped with oxygen at a level of 0.001 at %, through forms of AlON and even into nitrogen doped alumina with levels of down to 0.001 at %. Similarly, a solution to the problems of alumina can be found when introducing nitrogen during the production of the alumina film for the IMS.

When the deposited-dielectric layer includes low oxygen concentration, the deposited-dielectric layer may be referred to an oxygen-doped aluminum nitride. When the deposited-dielectric layer includes low to medium oxygen concentration, the AlON is in the form $Al_xO_yN_z$. When the deposited-dielectric layer includes high oxygen concentration, the deposited-dielectric layer is referred to nitrogen-doped $Al_2O_3$. In some embodiments, nitrogen is from 0.0001 to 15 at % in $Al_2O_3$.

In some embodiments, oxygen is from 0.0001 to 15 at % in AlN. In some embodiments, the deposited-dielectric layer includes Al-based oxynitride, which is formally represented by $Al_xO_yN_z$, where x, y, and z represent the atomic percent (at %) of Al, oxygen, and nitrogen, respectively, any ratio of variables x, y, and z are accepted, as long as the variables x, y, and z are (1) positive numbers and (2) above a representative amount that includes y and z levels above 0.001 at %, where y is from 0.001 at % to 49.999 at %, z is 0.001 at % to 49.999 at % and where y+z is about 50 at %.

The present device satisfies the four requirements for a deposited-dielectric layer for the IMS, which may include Al-based oxynitride deposited-dielectric layers among others. It should be noted that the disclosure is not limited to Al as a base for the oxynitride deposited-dielectric layers, but extends to other group III metals, such as Ga, Group II metals such as Mg and Cr, and Group IV metalloids, such as Si and Ge. For example, the deposited-dielectric layer may include GaON, SiON, or GeON among others.

In some embodiments, the deposited-dielectric layer can be further enhanced with the addition of doping element, such as hydrogen, carbon, among many other compounds, resulting in aluminum oxyhydronitride (AlHON) or aluminum oxycarbonitride (AlCON), among others.

In some embodiments, the Al can be replaced by any combination of Group III metals, Group II metals, and Group IV metalloids, such as SiGeON.

In some embodiments, like AlON corresponding to AlN and $Al_2O_3$, the deposited-dielectric layer may include SiON corresponding to a pair of silicon nitride (SiN) and silicon oxide ($SiO_2$), TiON corresponding to titanium nitride (TiN) and titanium oxide ($TiO_2$), and MgON corresponding to magnesium nitride (MgN) and magnesium oxide (MgO), among others. It will be appreciated by those skilled in the art that Ti or Mg can be replaced with other metals.

As used herein, an oxynitride, nitrogen-doped oxide or oxygen-doped nitride deposited-dielectric layer will be referred to as a metal-oxynitride. While the examples and disclosed embodiments are described with reference to a specific metal-oxynitride, AlON, other metal oxynitride compositions may be used. This may include the use of additional dopants, such as hydrogen or carbon, and additional metals/metalloids. Similarly, the various oxides and nitrides used to manufacture the IMS may be described with reference to a specific oxide (i.e. $Al_2O_3$) or a specific nitride (i.e. AlN), respectively. It will be appreciated by those skilled in the art that other oxides and nitrides may be used. Additionally, by way of example and not limitations, the metal and metalloid structures of the IMS may refer to Al. However, other metals or metalloid structures may be used.

Furthermore this method is not limited to any particular core-metal-substrate, The AlON IMS is not limited to 2D flat surfaces. It will be appreciated by those skilled in the art that that the AlON IMS can be in any complex shape or multiple shapes.

In some embodiments, the substrate may include a core-metal-substrate or a non-metal based substrate, such as graphite, thermal plastics, high temperature plastics, fiber reinforced composites (e.g. carbon reinforced composite), ceramic matrix composites, and layered laminates, among others. The set of all possible substrate including metal and non-metal will be herein called core-metal-substrate for simplification.

The AlON deposited-dielectric layer can combine the features of $Al_2O_3$ and AlN and provide strong substrate to film adhesion, higher thermal conductivity than $Al_2O_3$, higher dielectric constant, and also enhanced adhesion to the substrate including metal, metalloid and mixed metal metalloid substrates among others. In one aspect, the chemical bonding to the substrate changes from primarily ionic in alpha-$Al_2O_3$ to covalent in AlN.

FIG. 2B depicts an IMS including randomized $Al_xO_yN_z$ layer over a substrate according to an embodiment. As shown in FIG. 2B, the AlON has a non-columnar growth to form a randomized structure 6 rather than the columnar growth to form a columnar structure 5 as shown in FIG. 1D. The non-columnar structure or randomized structure 6 is not prone to cracking caused by the stress/strain between the metal-oxynitride layer 6 and the substrate 3.

FIG. 3 depicts an IMS including alternating dielectric layers (e.g. metal oxynitride layers) over a substrate according to an embodiment. As shown in FIG. 3, a multi-layer structure or film 7 is disposed over substrate 3. The multi-layer structure 7 includes two different alternating deposited-dielectric layers AlON 7A and AlON' 7B.

Metal-Oxynitride Film with Changing Composition for Top Metallization

Figures 4A, 4B, 4C, 4D:
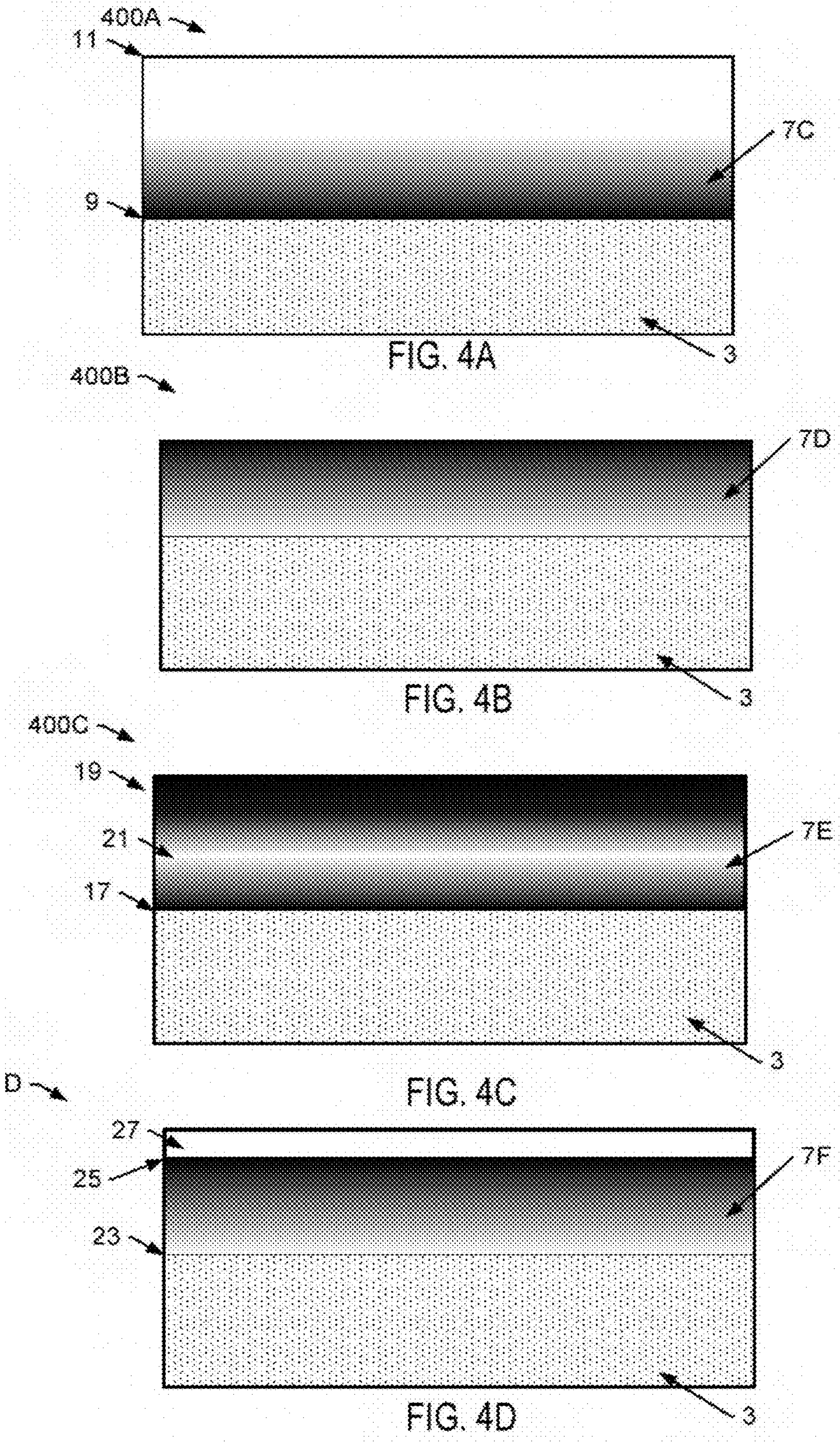
FIG. 4A depicts an IMS including a metal-oxynitride layer having a composition gradient with a top surface transitioning to AlON for stress mitigation according to an embodiment.
FIG. 4B depicts an IMS including a metal-oxynitride layer having a composition gradient with a top surface transitioning to Al for stress mitigation according to an embodiment.
FIG. 4C depicts an IMS including a metal-oxynitride layer having a composition gradient with an Al starting from the substrate transitioning to AlON and further transitioning to an Al top surface for stress mitigation according to an embodiment.
FIG. 4D depicts an IMS including a metal-oxynitride layer having a composition gradient of FIG. 4A for stress mitigation with a pre-metal-oxynitride adhesion layer according to an embodiment.

The IMS for supporting an electrical or acoustical device may have a changing composition at some point along the thickness of the deposited-dielectric layer, such that there is an increase in the ratio of metal to oxynitride such that it enhanced adhesion for subsequent metal or compound layers placed on top of the metal-oxynitride layer. The ratio of metal to oxynitride can be as high as 100% metal at the surface. Furthermore, the metal of the metal-oxynitride layer 7E can continue for a significant thickness from metal surface 19, as seen in FIG. 4C.

In one embodiment, the metal-oxynitride layer is applied to a substrate where the substrate is in the shape of a crucible. The crucible is then used to hold elements, such as nickel, for melting in common melting systems using resistive evaporation methods and e-beam evaporation methods, among others.

In one embodiment, the metal-oxynitride coating is applied to a substrate where the substrate is a phase change cooling system such as a heat pipe.

In one embodiment, a deposited-dielectric layer SiON is on an AlSi Substrate.

In one embodiment, an IMS includes AlON to $Al_2O_3$ for enhanced direct copper bonding, where Cu is the substrate and $Al_2O_3$ is the layer between AlON and the substrate In one embodiment, an IMS includes AlON to Al for enhanced top metal bonding, where Al is the post-metal-oxynitride adhesion layer, as shown in FIGS. 4C and 4D.

In one embodiment, AlON is disposed over a carbon-Al substrate.

In one embodiment, AlON is disposed on a W—Cu substrate.

In one embodiment, AlON is disposed on a near CTE matched substrate.

FIG. 4A depicts an IMS including a metal-oxynitride layer having a composition gradient with a top surface transitioning to AlON for stress mitigation according to an embodiment. As shown in FIG. 4A, an IMS 400A includes a composition gradient of AlON deposited-dielectric layer 7C over substrate 3. The composition gradient 7C starts with Al metal from the interface 7 between the AlON deposited-dielectric layer 7C and the substrate 3, transitions to AlON, and AlON ends on top surface 11 of the AlON deposited-dielectric layer 7C. The Al metal in the composition gradient can be replaced with other metals including Cu, Ti, TiW, Sn, SnAu, Ag, Cr, V, Sc, Y, and Au, among others.

FIG. 4B depicts an IMS including a metal-oxynitride layer having a composition gradient with a top surface transitioning to Al for stress mitigation according to an embodiment. As shown in FIG. 4B, an IMS 400B includes a composition gradient of AlON deposited-dielectric layer 7D over substrate 3. The composition gradient 7D starts with AlON from the interface 15 between the AlON deposited-dielectric layer 7D and the substrate 3, transitions to Al metal, and Al metal ends on top surface 13 of the AlON deposited-dielectric layer 7D.

FIG. 4C depicts an IMS including a metal-oxynitride layer having a composition gradient with an Al starting from the substrate transitioning to AlON and further transitioning to an Al top surface for stress mitigation according to an embodiment. As shown in FIG. 4C, an IMS 400C includes a composition gradient of AlON deposited-dielectric layer 7E over substrate 3. The composition gradient 7E starts with Al metal from the interface 17 between the AlON deposited-dielectric layer 7E and the substrate 3, transitions to AlON 21, and further transitions to Al metal, and Al metal ends on top surface 19 of the AlON deposited-dielectric layer 7E.

FIG. 4D depicts an IMS including a metal-oxynitride layer having a composition gradient of FIG. 4A for stress mitigation with a post-metal-oxynitride adhesion layer according to an embodiment. As shown in FIG. 4D, an IMS 400D includes a composition gradient of AlON deposited-dielectric layer 7F over substrate 3. The composition gradient 7F starts with AlON from the interface 23 between the AlON deposited-dielectric layer 7F and the substrate 3, transitions to Al metal, and Al metal ends on top surface 25 of the AlON deposited-dielectric layer 7F. The IMS 400D also includes a post-metal-oxynitride adhesion layer 27, which may be formed of a metal. This metal can be different from the metal in the deposited-dielectric layer 7F which can be a metal-oxynitride layer.

FIG. 5A depicts an IMS including a metal-oxynitride layer having an intra metal sublayer for stress mitigation according to an embodiment. As shown in FIG. 5A, an IMS 500A includes a stress-reduction layer 29 between the AlON deposited-dielectric layer 7 and the substrate 3. In some embodiments, a sublayer of metal or other compounds can be used as stress reducing layer. As shown in FIG. 5A, a thin sublayer 29 of metal or other compounds may be present between the substrate 3 and the deposited-dielectric layer 7. The thin sublayer 29 may be plastically deformed to help stress mitigation. The thin sublayer 29 may also be used for improving adhesion or reduce mismatch of coefficient of thermal expansion (CTE) between the deposited-dielectric layer 7 and the substrate. The sublayer 29 may also be referred to a pre-metal-oxynitride adhesion layer. In one embodiment, an IMS includes Al to AlON for enhanced substrate bonding, where Al is the pre-metal-oxynitride adhesion layer.

FIG. 5B depicts an IMS including a metal-oxynitride layer having a thin intra metal sublayer and a thick extra metal layer for stress mitigation according to an embodiment. As shown in FIG. 5B, an IMS 500B includes a thin stress-reduction layer 29 between the AlON deposited-dielectric layer 7 and the substrate 3, and a thick stress-reduction layer 29 at the bottom of the substrate 3.

FIG. 5C depicts an IMS including a thin intra metal sublayer between two metal-oxynitride layers for stress mitigation according to an embodiment. As shown in FIG. 5C, an IMS 500C includes a stress-reduction layer 29 between a first AlON deposited-dielectric layer 7 and a second AlON deposited-dielectric layer 7, which is over the substrate 3. In one embodiment, the IMS 500C includes AlON to Al to AlON as a stress reduction method, where Al is the stress reduction metal layer 27.

In some embodiments, a sublayer of metal or other compounds can be used as stress reducing layer.

Figure 6A:
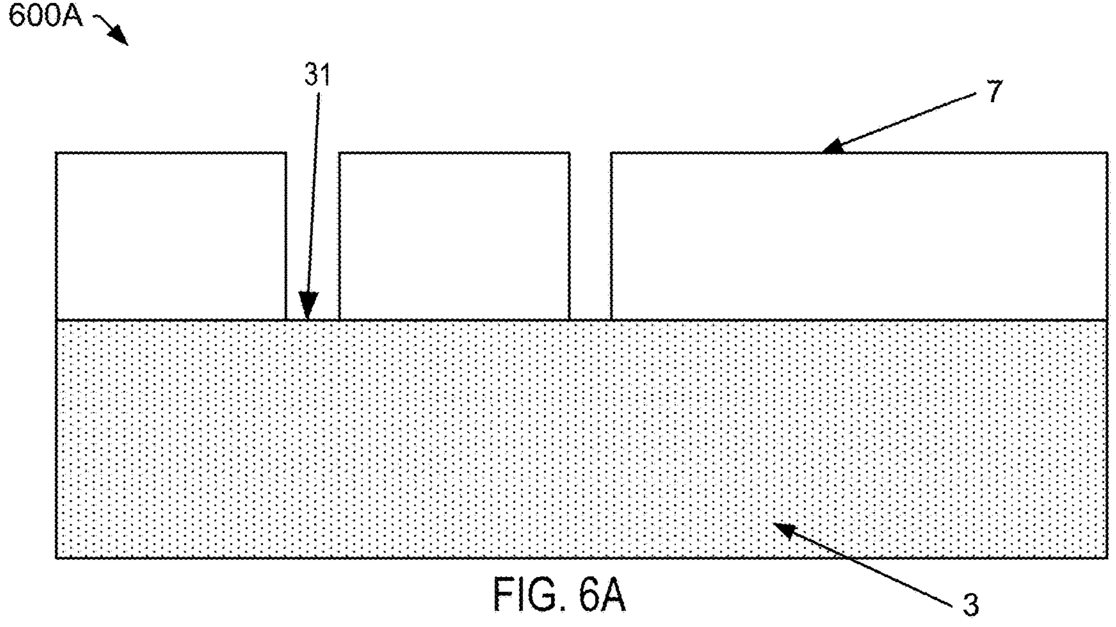
FIG. 6A depicts an IMS including a patterned deposited-dielectric layer over a substrate according to an embodiment.

FIG. 6A depicts an IMS including a patterned deposited-dielectric layer over a substrate according to an embodiment. As shown in FIG. 6A, an IMS 600A includes a deposited-dielectric layer 7 having etched portion 31 over a substrate 3.

Figure 6B:
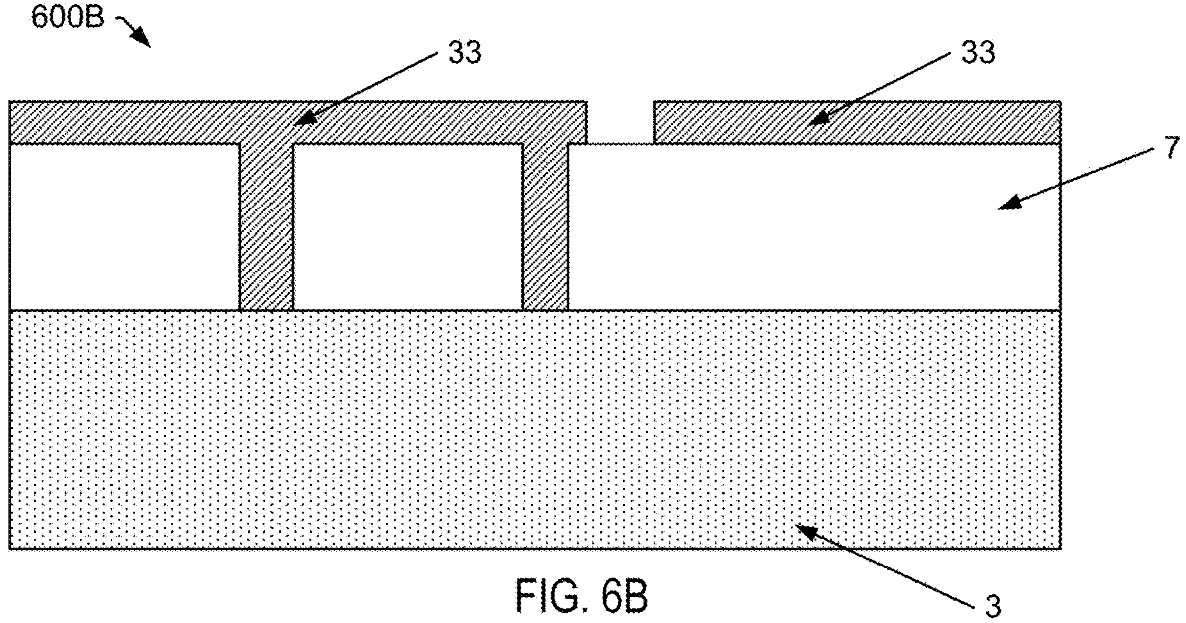
FIG. 6B depicts an IMS board including a subsequent metal layer over the IMS of FIG. 6A according to an embodiment.

FIG. 6B depicts an IMS board including a subsequent metal layer over the IMS of FIG. 6A according to an embodiment. As shown in FIG. 6B, an IMS board 600B includes a deposited-dielectric layer 7 having etched portion 31 over a substrate 3. The IMS board 600B also includes a subsequent metal layer 33 over the deposited-dielectric layer 7 and also fills in the etched portion 31 of the deposited-dielectric layer 7 to directly contact the substrate 3. The subsequent layer 33 is patterned, for example, by etching, to have a gap 34 over the top of the deposited-dielectric layer 7.

Figures 7A, 7B, 7C:
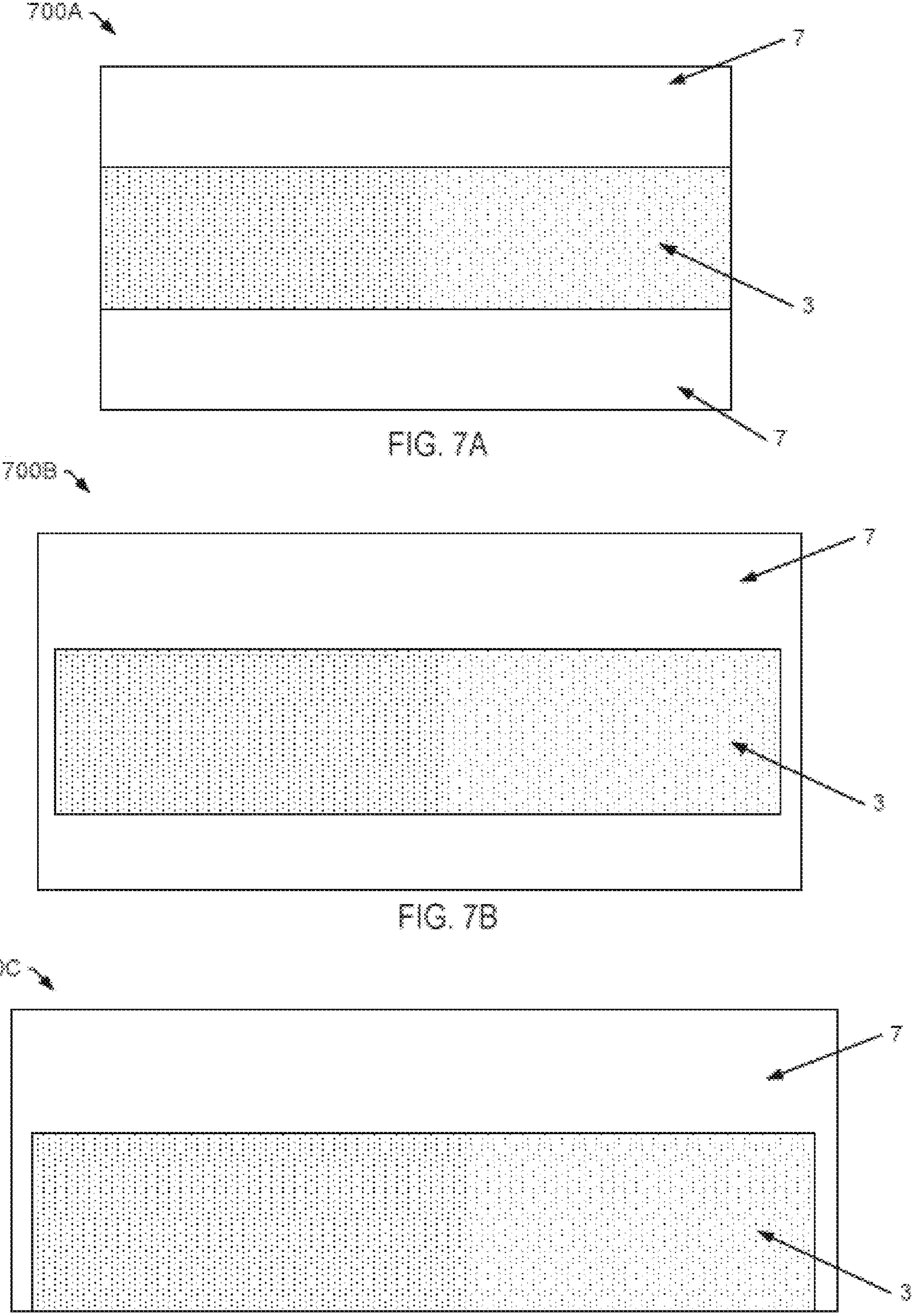
FIG. 7A depicts an IMS including a metal-oxynitride layer over the top and bottom of the substrate according to an embodiment.
FIG. 7B depicts an IMS including a metal-oxynitride layer over the top and bottom as well as two sidewalls of the substrate according to an embodiment.
FIG. 7C depicts an IMS including a metal-oxynitride layer over the top and two sidewalls of the substrate according to an embodiment.

FIG. 7A depicts an IMS including a metal-oxynitride layer over the top and bottom of the substrate according to an embodiment. As shown in FIG. 7A, an IMS 700A includes a substrate 3 and deposited-dielectric layers 7 on both top and bottom of the substrate 3. The thickness of the deposited-dielectric layers 7 may be the same or different. A seed layer (not shown) may be present between the deposited-dielectric layers 7 and the substrate 3. The seed layer may include Ti, TiW, Cr, among others. Both sides of the substrate 3 can be coated with deposited-dielectric layers 7 for electrical isolation and stress mitigation.

In one embodiment, both sides of the substrate 3 can be coated with deposited-dielectric layer 7 for stress removal.

In one embodiment, both sides of the substrate 3 can be coated with deposited-dielectric layer 7 to promote integration to next level steps in subsequent use of the IMS.

In one embodiment, both sides of the substrate 3 can be coated with AlON 7 of the same thickness.

In one embodiment, both sides of the substrate 3 can be coated with AlON 7 of different thicknesses.

FIG. 7B depicts an IMS including a metal-oxynitride layer over the top and bottom as well as two sidewalls of the substrate according to an embodiment. As shown in FIG. 7B, an IMS 700B includes a substrate 3 and deposited-dielectric layers 7 on the top, bottom, and sidewalls of the substrate 3.

FIG. 7C depicts an IMS including a metal-oxynitride layer over the top and two sidewalls of the substrate according to an embodiment. As shown in FIG. 7C, an IMS 700C includes a substrate 3 and deposited-dielectric layers 7 on the top and sidewalls of the substrate.

Core-Metal-Substrate

In one embodiment, the metal-oxynitride layer is applied to a substrate where the substrate where the substrate is shaped with metal fins to dissipate heat. In such an embodiment, the fins may be cooled naturally, with forced air, with liquid such as water or any other commonly known cooling methods.

Figure 8A:
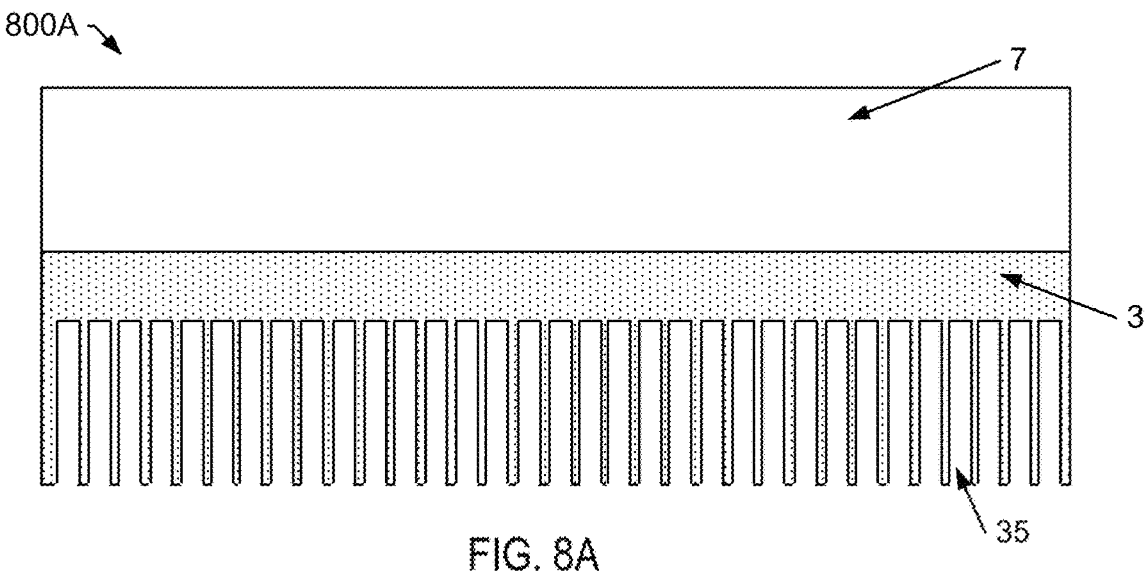
FIG. 8A depicts an IMS including a metal-oxynitride layer over a finned substrate according to an embodiment.
Figure 8B:
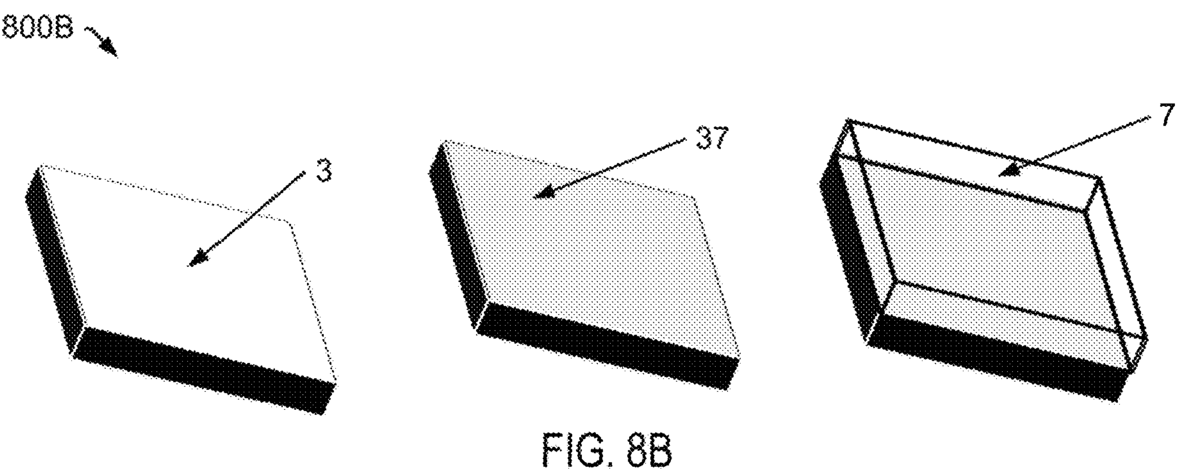
FIG. 8B depicts an IMS including a metal-oxynitride layer over a textured substrate according to an embodiment.

FIG. 8A depicts an IMS including a metal-oxynitride layer over a finned substrate according to an embodiment. As shown in FIG. 8A, an IMS 800A includes a deposited-dielectric layer 7 over a core-metal-substrate 3 having finned portions 35 in the opposite side to the dielectric layer 7. The finned portions 35 expand the surface area of the substrate 3 for better thermal extraction. FIG. 8B depicts an IMS including a metal-oxynitride layer over a textured substrate according to an embodiment.

As shown in FIG. 8B, an IMS 800B includes a deposited-dielectric layer 7 over the core-metal-substrate 3 having a textured surface 37 for better thermal extraction. As shown, the deposited-dielectric layer 7 is disposed over the textured surface.

Figure 8C:
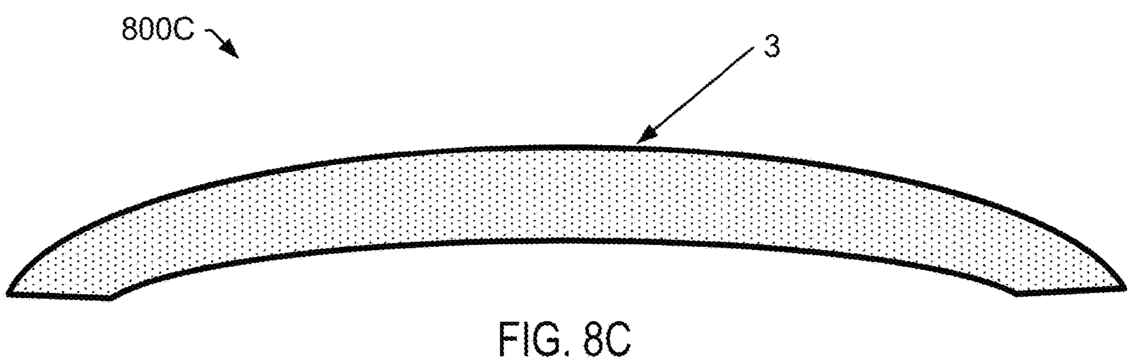
FIG. 8C depicts a pre-stressed substrate according to an embodiment.

In one embodiment, the substrate can be pre-shaped to counter any deformation from deposition. FIG. 8C depicts a pre-stressed substrate according to an embodiment. As shown in FIG. 8C, the substrate 3 can be pre-stressed by mechanical means. Pre-stress/strain control of the core-metal-substrate may be achieved by physical means as well.

In one embodiment, the core-metal-substrate may be actively cooled for better thermal extraction.

In one embodiment, the substrate can be cut into subsequent subcomponents where they are still attached via one or many small attachment points.

In one embodiment, the substrate can be bonded to a carrier wafer. The carrier wafer can be of any material.

In one embodiment, the core-metal-substrate is textured for better stress/strain management.

Pre-stress/strain relief of the core-metal-substrate can also be achieved by back-side patterning of secondary/added layer or thickness changes to the core-metal-substrate or the deposited-dielectric layer.

In one embodiment, the substrate can be pre-stressed by application of a coating to the back-side of the wafer. This coating does not need to be solid and it may be preferable to have the coating patterned.

In one embodiment, the deformation of the substrate can be mitigated by application of a coating, either front or back. This coating does not need to be solid and it may be preferable to have the coating pattered.

In one embodiment, the substrate can be cooled during deposition to mitigate thermal warping or deformation.

IMS Board

Several exemplary configurations of the IMS board are illustrated below. It will be appreciated by those skilled in the art that the IMS may vary in configurations.

Figure 9A:
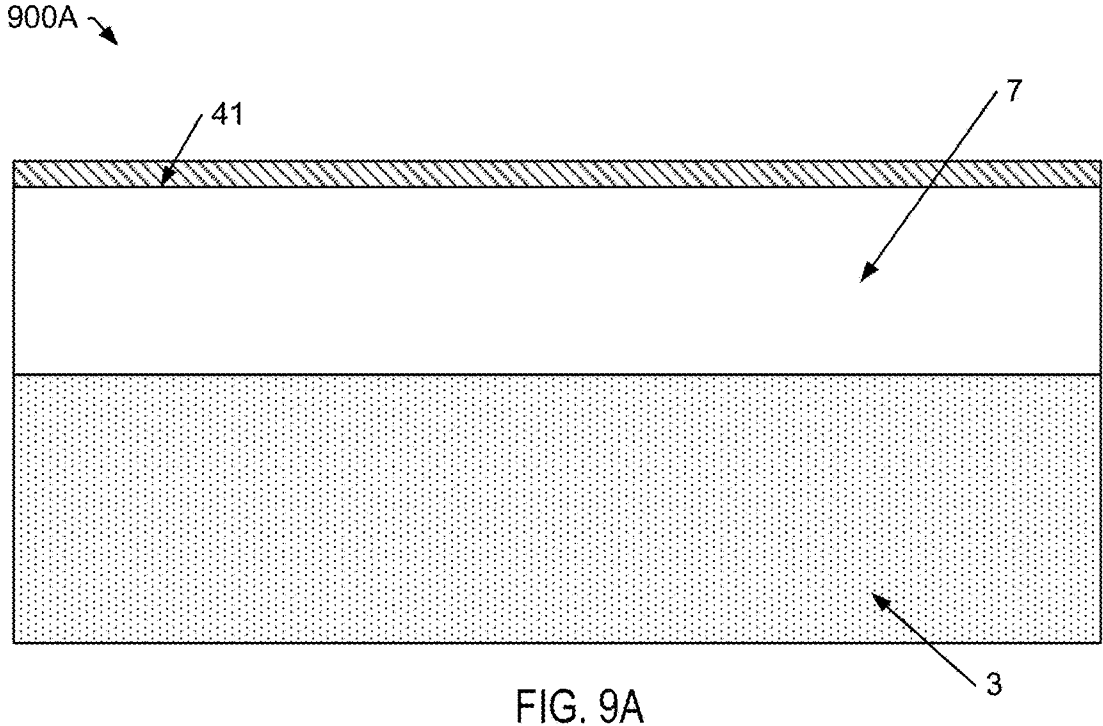
FIG. 9A depicts an IMS board including a subsequent metal layer over the IMS of FIG. 2A according to an embodiment.

FIG. 9A depicts an IMS board including a subsequent metal layer over the IMS of FIG. 2A according to an embodiment. As shown in FIG. 9A, an IMS board 900A includes a subsequent metal layer 41 over a deposited-dielectric layer 7 (e.g. metal oxynitride layer or $Al_xO_yN_z$), which is disposed over a core-metal-substrate 3.

Figure 9B:
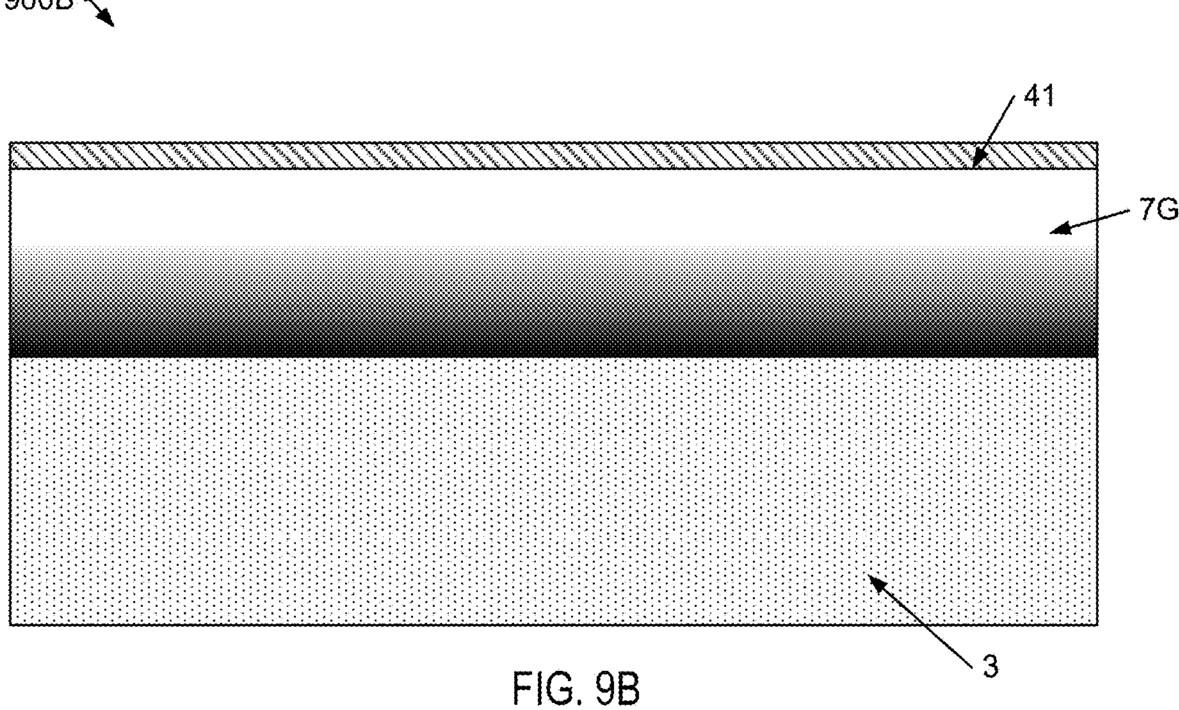
FIG. 9B depicts an IMS board including a subsequent metal layer over the IMS of FIG. 4A according to an embodiment.

FIG. 9B depicts an IMS board including a subsequent metal layer over the IMS of FIG. 4A according to an embodiment. As shown in FIG. 9B, an IMS board 900B includes a subsequent metal layer 41 over a composition gradient of deposited-dielectric layer 7G, which is disposed over a core-metal-substrate 3.

Figure 9C:
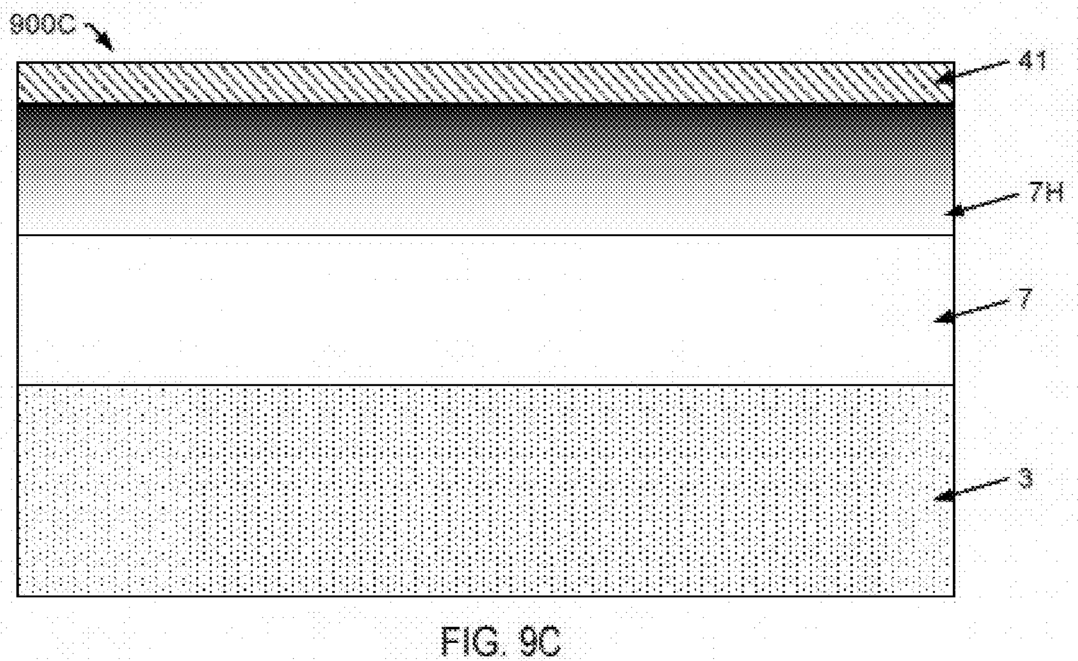
FIG. 9C depicts an IMS board including a subsequent metal layer over an IMS including a composition gradient layer and a deposited-dielectric layer over a substrate according to an embodiment.

FIG. 9C depicts an IMS board including a subsequent metal layer over an IMS including a composition gradient layer and a deposited-dielectric layer over a substrate according to an embodiment. As shown in FIG. 9C, an IMS board 900C includes a subsequent metal layer 41 over a composition gradient of deposited-dielectric layer 7H, which is disposed over a deposited-dielectric layer 7, which is further disposed over a core-metal-substrate 3.

Figure 9D:
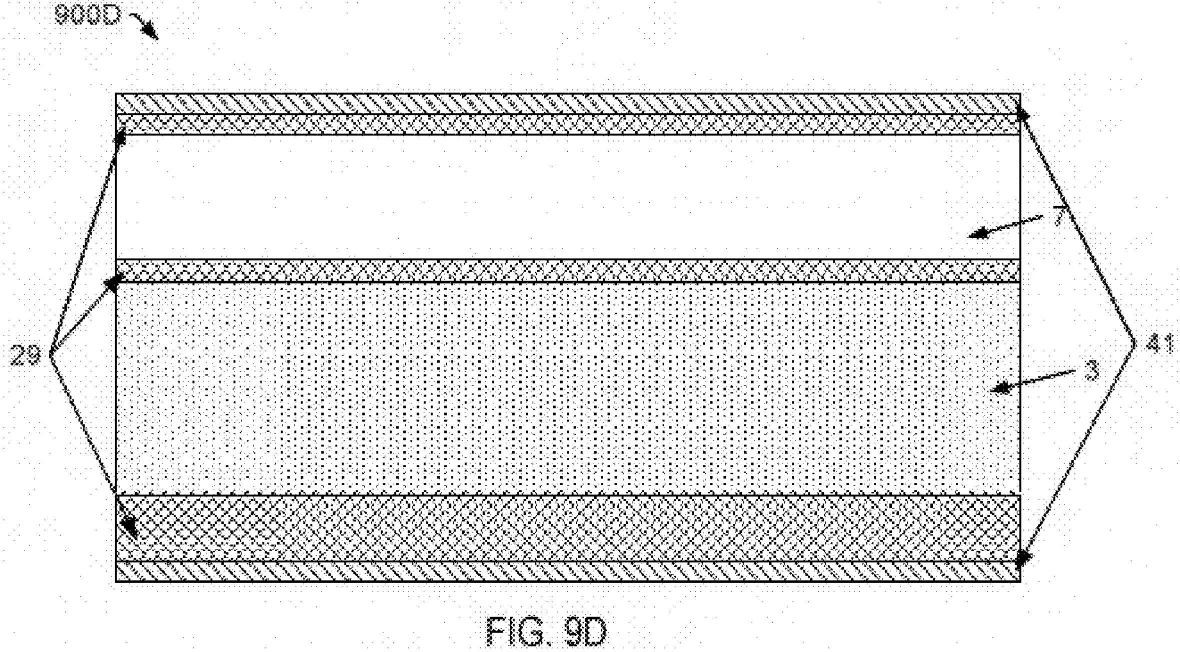
FIG. 9D depicts an IMS board including a subsequent metal layer over an IMS including multiple stress reduction layers and a deposited-dielectric layer according to an embodiment.

FIG. 9D depicts an IMS board including a subsequent metal layer over an IMS including multiple stress reduction layers and a deposited-dielectric layer according to an embodiment. As shown in FIG. 9D, an IMS board 900D includes a first subsequent metal layer 41 over a first stress reduction layer 29, a deposited-dielectric layer 7, and a second stress reduction layer 29 over a substrate 3. The IMS board 900D also includes a third thicker stress reduction layer 29 over the bottom of the substrate 3. The IMS board 900D further includes a second subsequent metal layer 41 next to the third subsequent metal layer 41.

IMS System

Figure 10A:
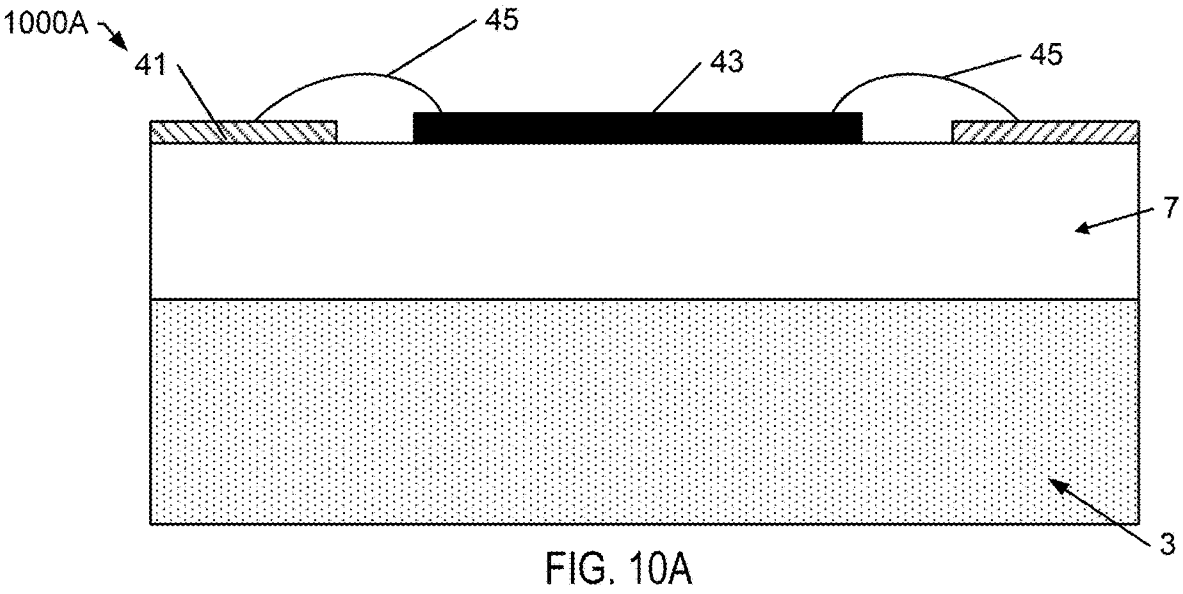
FIG. 10A depicts an IMS system including an electronic device over a patterned IMS board according to an embodiment.

FIG. 10A depicts an IMS system including an electronic device over a patterned IMS board according to an embodiment. As shown in FIG. 10A, an IMS system 1000A includes a patterned subsequent metal layer 41 over a deposited-dielectric layer 7 supported by a substrate 3. The IMS system 1000A also includes an electronic device 43 attached to the deposited-dielectric layer 7. The IMS system 1000A further includes wires 45 connected between the subsequent metal layer 41 and the electronic device 43.

Figure 10B:
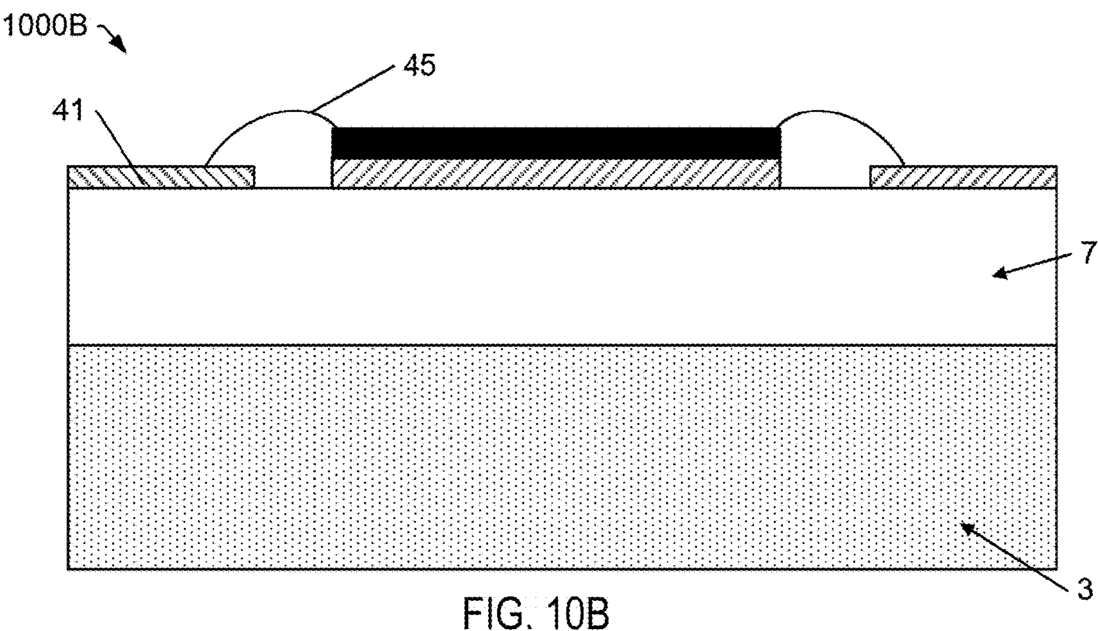
FIG. 10B depicts an IMS system including an electronic device over a different patterned IMS board according to an embodiment.

FIG. 10B depicts an IMS system including an electronic device over a different patterned IMS board according to an embodiment. As shown in FIG. 10B, an IMS system 1000B includes a patterned subsequent metal layer 41 over a deposited-dielectric layer 7 supported by a substrate 3. The IMS system 1000B also includes an electronic device 43 attached to the subsequent metal layer 41 which is disposed over deposited-dielectric layer 7. The IMS system 1000B further includes wires 45 connected between the subsequent metal layer 41 and the electronic device 43.

In one embodiment, the metal-oxynitride layer is applied to a substrate where the substrate is in the shape of a crucible, or three dimensional (3D). The crucible is then used to hold electronic devices such as LEDs, IGBTs and piezoelectric devices.

Figure 10C:
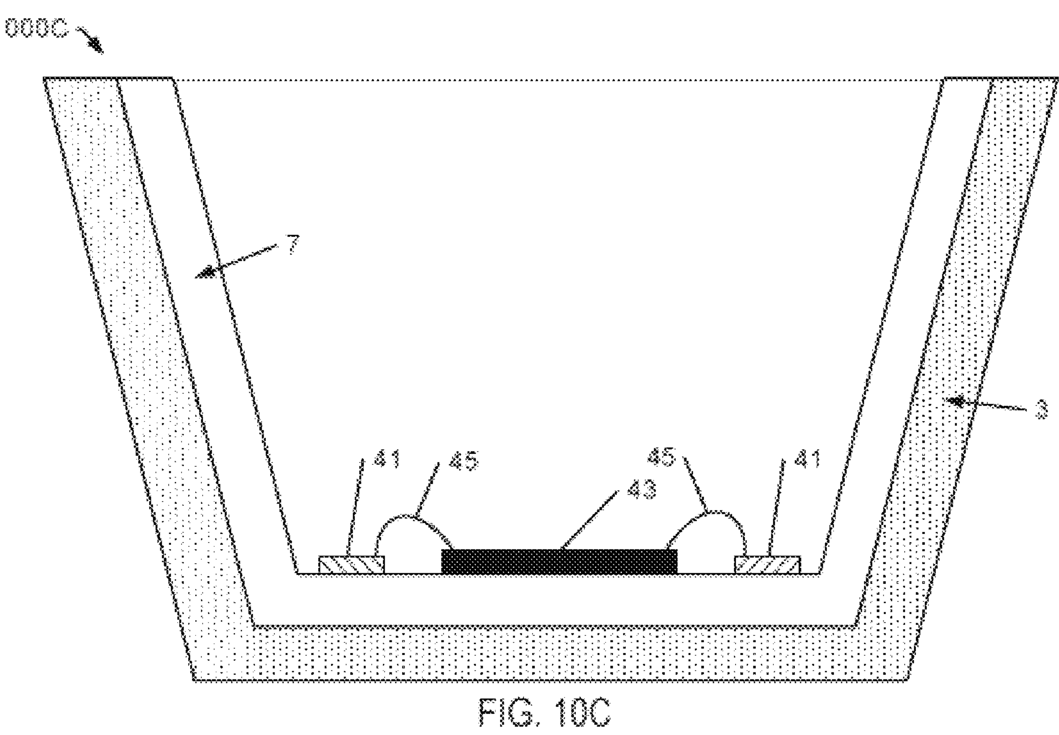
FIG. 10C depicts an IMS system including an electronic device over a 2D patterned IMS board according to an embodiment.

FIG. 10C depicts an IMS system including an electronic device over a 2D patterned IMS board according to an embodiment. As shown in FIG. 10C, an IMS system 1000C includes a 2D patterned subsequent metal layer 41 over a flat bottom of a 3D deposited-dielectric layer 7 supported by a 3D substrate 3. The IMS system 1000C also includes an electronic device 43 attached to the patterned subsequent metal layer 41. The IMS system 1000A further includes wires 45 connected between the subsequent metal layer 41 and the electronic device 43.

Figure 10D:
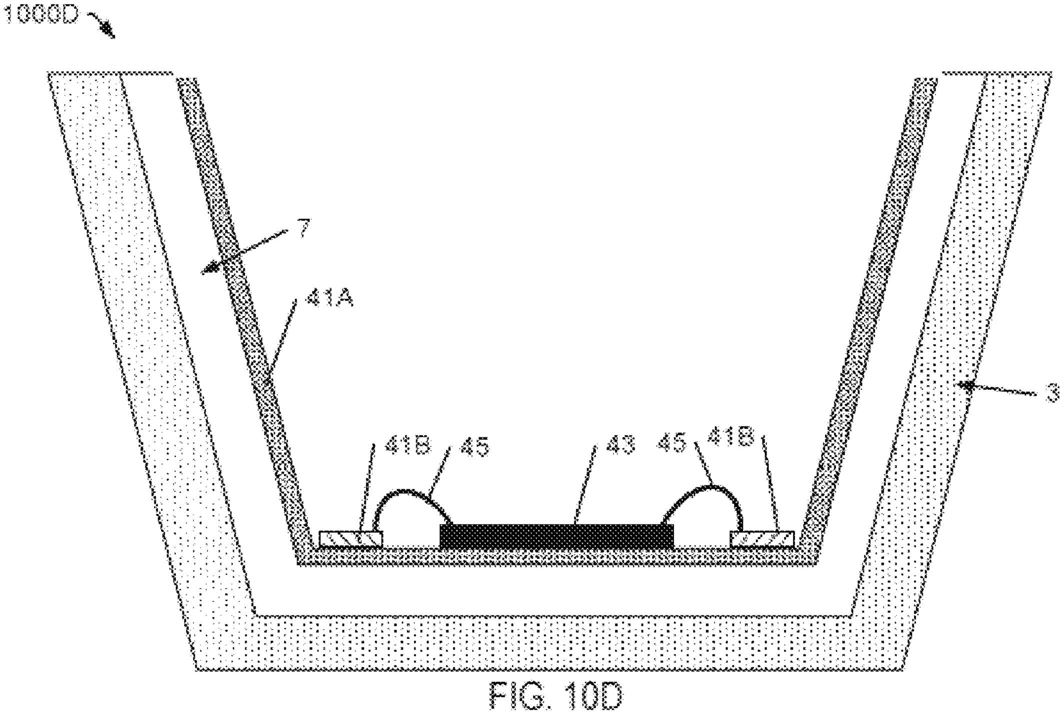
FIG. 10D depicts an IMS system including an electronic device over a 3D IMS board according to an embodiment.

FIG. 10D depicts an IMS system including an electronic device over a 3D IMS board according to an embodiment. As shown in FIG. 10D, an IMS system 1000D includes a first subsequent metal layer 41A over a 3D IMS board including a 3D deposited-dielectric layer 7 supported by a 3D substrate 3. As shown, the first subsequent layer is in a 3D shape, the same as the 3D shape of the substrate 3. The IMS system 1000C also includes a patterned second subsequent metal layer 41B over a flat bottom of the 3D subsequent metal layer 41A. The patterned second subsequent layer 41B is in a 2D shape. The IMS system 1000C further includes an electronic device 43 attached to the 2D patterned second subsequent metal layer 41B. The IMS system 1000A also includes wires 45 connected between the second subsequent metal layer 41B and the electronic device 43. The first subsequent metal layer 41A may be polished to be reflective or used as a mirror.

High Electrical Insulation and High Thermal Conductivity

The issue arising with in an IMS is the need for both a high thermal conductivity and a high dielectric constant. AlON deposited-dielectric layers have been directly deposited on core-metal-substrates with high thermal conductivity and high electrical standoff voltage.

In some embodiments, the electrical standoff voltage can be as high as 250 volts per micron, which has been achieved on Cu and SiAl substrates. This electrical standoff voltage exceeds a standard electrical standoff voltage of 190-200 volts per micron for electronic devices.

An AlON dielectric layer may be formed on a Nb substrate. Table 1 illustrates various oxygen and nitrogen compositions for AlON dielectric layer on a Nb substrate.

TABLE 1

Oxygen and Nitrogen Variations in Various AION Samples

| Elt. | Line | Intensity (c/s) | Error 2-sig | Conc | Units | | Elt. | Line | Intensity (c/s) | Error 2-sig | Conc | Units | |
|---|---|---|---|---|---|---|---|---|---|---|---|---|---|
| N | Ka | 5.31 | 0.838 | 1.224 | wt. % | | N | Ka | 28.45 | 0.795 | 27.692 | wt. % | |
| O | Ka | 22.88 | 1.740 | 10.013 | wt. % | | O | Ka | 31.37 | 0.835 | 22.367 | wt. % | |
| Al | Ka | 23.65 | 1.769 | 0.579 | wt. % | | Al | Ka | 1,204.17 | 5.173 | 49.454 | wt. % | |
| Nb | La | 1,593.21 | 14.519 | 88.184 | wt. % | | Nb | La | 2.75 | 0.247 | 0.487 | wt. % | |
| | | | | 100.000 | wt. % | Total | | | | | 100.000 | wt. % | Total |
| kV | | 25.0 | | | | | kV | | 25.0 | | | | |
| Takeoff Angle | | 35.0° | | | | | Takeoff Angle | | 35.0° | | | | |
| Elapsed Livetime | | 30.2 | | | | | Elapsed Livetime | | 180.0 | | | | |
| **Elt.** | **Line** | **Intensity (c/s)** | **Error 2-sig** | **Conc** | **Units** | | **Elt.** | **Line** | **Intensity (c/s)** | **Error 2-sig** | **Conc** | **Units** | |
| N | Ka | 41.33 | 0.958 | 25.247 | wt. % | | N | Ka | 17.11 | 0.617 | 18.678 | wt. % | |
| O | Ka | 21.78 | 0.696 | 7.641 | wt. % | | O | Ka | 46.63 | 1.013 | 30.056 | wt. % | |
| Al | Ka | 3,966.23 | 9.388 | 67.112 | wt. % | | Al | Ka | 1,008.26 | 4.733 | 48.500 | wt. % | |
| | | | | 100.000 | wt. % | Total | Nb | La | 13.79 | 0.554 | 2.766 | wt. % | |
| | | | | | | | | | | | 100.000 | wt. % | Total |
| kV | | 25.0 | | | | | | | | | | | |
| Takeoff Angle | | 35.0° | | | | | kV | | 25.0 | | | | |
| Elapsed Livetime | | 180.0 | | | | | Takeoff Angle | | 35.0° | | | | |
| | | | | | | | Elapsed Livetime | | 180.0 | | | | |
| **Elt.** | **Line** | **Intensity (c/s)** | **Error 2-sig** | **Conc** | **Units** | | **Elt.** | **Line** | **Intensity (c/s)** | **Error 2-sig** | **Conc** | **Units** | |
| N | Ka | 23.11 | 0.717 | 22.352 | wt. % | | H | Ka | 9.41 | 0.645 | 26.277 | wt. % | |
| O | Ka | 9.66 | 0.463 | 4.761 | wt. % | | O | Ka | 3.10 | 0.370 | 5.069 | wt. % | |
| Al | Ka | 3,061.43 | 8.248 | 72.789 | wt. % | | Al | Ka | 838.47 | 6.085 | 66.553 | Wt. %. | |
| Nb | La | 0.70 | 0.124 | 0.098 | wt. % | | Ar | Ka | 2.14 | 0.307 | 0.244 | wt % | |
| | | | | 100.000 | wt. % | Total | Cu | Ka | 9.05 | 0.632 | 1.857 | wt. %. | |
| | | | | | | | | | | | 100.000 | wt % | Total |

TABLE 1-continued

Oxygen and Nitrogen Variations in Various AlON Samples

| | | | |
|---|---|---|---|
| kV | 25.0 | kV | 25.0 |
| Takeoff Angle | 35.0° | Takeoff Angle | 35.0° |
| Elapsed Livetime | 180.0 | Elapsed Livetime | 90.6 |

| Elt. | Line | Intensity (c/s) | Error 2-sig | Conc | Units |
|---|---|---|---|---|---|
| N | Ka | 29.05 | 1.759 | 28.157 | wt. % |
| O | Ka | 4.80 | 0.715 | 2.837 | wt. % |
| Al | Ka | 3,303.51 | 18.753 | 66.410 | wt. % |
| Cu | Ka | 70.31 | 2.736 | 2.597 | wt. % |
| | | | | 100.000 | wt. % Total |

| | |
|---|---|
| kV | 30.0 |
| Takeoff Angle | 35.0° |
| Elapsed Livetime | 37.6 |

As shown in Table 1, the ratio of oxygen to nitrogen varies with AlON samples. For example, Sample 1, the top one in the left column, has 1.224 wt % N, and 10.013 wt %0. Sample 2, the second one from the top in the left column, has 25.247 wt % N and 7.641 wt %0. Sample 3, the third one from the top in the left column, has 22.352 wt % N, and 4.761 wt %0. Sample 4, the bottom one in the left column, has 28.157 wt % N and 2.837 wt %0. Sample 5, the top one in the right column, has 27.692 wt % N, and 22.367 wt %0, Sample 6, the second one from the top in the right column, has 18.678 wt % N and 30.056 wt %0. Sample 7, the bottom one in the right column, has 26.277 wt % N, and 5.069 wt %0.

By changing the ratio of oxygen to nitrogen, the adhesion of the AlON dielectric layer to the substrate may vary, and the CTE of the AlON dielectric layer may also vary.

When an oxygen content increases in the AlON dielectric layer, the bonding improves with increasing oxygen content. The electrical insulation voltage also increases with the oxygen content. For example, when the oxygen content is relatively low, the columnar structure of AlN is changing toward randomized structure. When the oxygen content exceeds a threshold value, the columnar structure can be eliminated. Instead, a randomized structure 6 is formed over a substrate 3, as shown in FIG. 2B.

The electrical insulation increases when the electrical resistivity of the metal-oxynitride layer (e.g. AlON) increases. Table 2 shows resistivity vs. oxygen level in AlON dielectric layer of 10 μm thick.

TABLE 2

| Oxygen at % | Electrical Resistivity DC @200 V (ohms * m) | Thickness (μm) | Contact pad size ($mm^2$) |
|---|---|---|---|
| 0 (pure AlN) | $3.2 \times 10^{11}$ | 10 | 25 |
| 4 | $7.2 \times 10^{13}$ | 10 | 25 |
| 10 | $1.9 \times 10^{14}$ | 10 | 25 |
| 20 | $1.4 \times 10^{15}$ | 10 | 25 |
| 100 ($Al_2O_3$) | $3.4 \times 10^{14}$ | 10 | 25 |

As shown, an electrical resistivity increases with oxygen level. For example, when the oxygen increases from 0 to 4%, the electrical resistivity significantly increases from $3.2\times10^{11}$ to $7.2\times10^{13}$ ohms*m. When oxygen continuously increases from 4% to 10% and 20%, the electrical resistivity increases to $1.4\times10^{15}$ ohms*m, which is even higher than $3.4\times10^{14}$ for pure $Al_2O_3$.

In one embodiment, other elements or compounds can be used to increases thermal conductivity during deposition.

In one embodiment, the IMS has breakdown voltage above 50 V/μm.

Adhesion to Substrate

Another issue with the IMS is the need for the deposited-dielectric layer to have sufficient adhesion to the core-metal-substrate. As an example, AlON IMS was subjected to a series of rapid thermal cycles, with standard heating temperature oscillations ranging from 100° C.-200° C. and high heating temperature oscillations ranging from 400° C.-500° C. The anamorphic nature of the AlON leads to random bonding at the core-metal-substrate surface. Referring to FIG. 2B again, the IMS includes randomized deposited-dielectric layer. In the case of Cu substrate with AlON, Cu—O, Cu—N Al—Cu, Al—O Al—O—N, Cu—O—N bonds can be formed. With the addition of H, metal-oxynitride, and hydroxide bonds can be formed. All of these bonds lead to stronger and more resilient adhesion.

In one embodiment, metal-metal-O bond (a non-columnar micro crystalline structure bonding to the under substrate would allow for both the strong Al—Cu bonds).

Additionally, by creating a metal composition gradient transition from the substrate to the AlON, as illustrated in FIGS. 4A-4C, adhesion can be further increased and the stress/strain between the AlON and the substrate can be altered. The metal composition gradient can have thickness ranging from angstroms to tens of microns or more. It should be noted the metal composition gradient can be made of any metal or compound. Also, the metal composition gradient can be made from a mixture of either metals or metal/compounds.

In some embodiments, ratio of free metal to metal-oxynitride decreases further from the deposition surface for the subsequent metal layer to enhance adhesion of metal-oxynitride layer.

In one embodiment, other elements are deposited using a composition gradient of the elements in the AlON to increase adhesion.

In one embodiment, other elements can be used to increases adhesion during deposition to alter the stress profile.

In one embodiment, other elements can be Al, Cu, Ti, W, Si, Ni, Ta, Os, Si, individually or in any mixture thereof.

In one embodiment, other compounds can be used to increases adhesion during deposition such as S, P, As, Cr, V, Ag, Au, In, Cd, B, Mg, Ga individually or in any mixture thereof.

Coefficient of Thermal Expansion (CTE) Mismatch Forces

A further problem for the IMS is coefficient of thermal expansion (CTE) mismatch force, stress and/or strain, collectively referred to herein as thermal expansion forces between the metal and the deposited-dielectric layer: the metal composition gradient can be further used to control thermal expansion forces or a second layer can be added onto the metal composition gradient canceling out the thermal expansion forces.

In the case of AlN on Cu substrate, the high coefficient of thermal expansion (CTE) mismatch (CTE is $4.5\times10^{-6}$/° C. for AlN and $17\times10^{-6}$/° C. for Cu) plays a large role. The mismatch is further increased when aluminum is used as core-metal-substrate (CTE is $23\times10^{-6}$/° C. for aluminum). The CTE mismatch can cause cracking and delamination under thermal cycling.

Referring to FIG. 5A again, an aluminum layer can be added as an intra-layer 29 between the core-metal-substrate 3 and the deposited-dielectric layer 7 of such a thickness, and or crystalline quality and or grain size (thickness for simplification herein) to allow for elastic deformation, plastic deformation, shear forces deformation, or slip deformation of the aluminum layer, which relieve the forces (forces is used for simplification) between the core-metal-substrate and the deposited-dielectric layer.

For all cases below, aluminum is used for simplification, but other metals can be used and is not limited to single metals including Zn, Ag, Au, In, Sn, Cd among others, and an alloy of metals including SnAl, AlIn, among others).

In one embodiment, ratio of free metal to metal-oxynitride decreases further from the deposition surface to enhance stress reduction of metal-oxynitride layer.

In one embodiment, both sides of the substrate 3 can be coated with AlON 7 of the same thickness or different thickness to reduce stress/strain from CTE mismatch.

Referring to FIGS. 4A-4C again, AlON 7 is deposited using a composition gradient of the AlON. The composition gradient may alter the stress profile, or alter the adhesion of subsequent metal layers. The deposited composition gradient starts as AlON on the top of the substrate 3 and ends as an Al surface, as shown in FIG. 4D. Then, a metal layer 27 is deposited over the Al surface.

In one embodiment, both sides of the substrate 3 can be coated one side with AlON 7 and the second side with a stress/strain mitigating layer.

In one embodiment, the oxygen to nitrogen ratio can be changed in the gradient to change the CTE of the layer, or better match CTE of substrate material.

In one embodiment, the substrate can pre-masked by application of a coating.

In one embodiment, the substrate can be pre-masked by application of a physical hard mask in the form of a negative image of the desired application area on the substrate.

Substrate Surface Preparation and Oxygen Treatment

Core-metal-substrate preparation can be important in the resulting deposited-dielectric layer. The preparation of the core-metal-substrate can be achieved by any commonly known metal treatment. More advanced methods are shown in "Technique for obtaining ultra smooth Cu surfaces final polishing utilizing nano-bubble water and vacuum ultraviolet light" 2012. Wet, PH controlled surface preparation can be utilized. Such a process is described in U.S. Pat. No. 7,153,445B2. In addition, material may be added using any commonly known technique to the surface, and then the material may be removed by back etching or any of the above methods to acquire the desired surface for deposition. Regardless of methods, the goal is to achieve a more consistent surface for deposition. Other preparations can be performed beyond simple polishing and flattening of the surface.

In one embodiment, oxygen, reacted with the surface, is further used to roughen the substrate surface to increase mechanical bonding of the metal-oxynitride coating with the substrate.

In one embodiment, oxygen, reacted with the surface, is further used to preferentially change the crystal structure of the coating to increase mechanical bonding of the metal-oxynitride coating with the substrate.

In one embodiment, an oxidized pretreatment is used on the substrate to enhance chemical bonding of the metal-oxynitride coating with the substrate.

In one embodiment, an oxidation pretreatment is used to roughen the substrate to increase mechanical bonding of the metal-oxynitride coating with the substrate.

In one embodiment, an oxidation pretreatment of the substrate is used to increase the chemical bonding of the metal-oxynitride coating with the substrate.

IMS Deposition Process

In an embodiment, a metal-oxynitride deposited-dielectric layer (e.g. AlON) is deposited on a copper substrate to act as a deposited-dielectric layer. The deposition of AlON over the copper substrate may include reactive sputtering of aluminum metal in a nitrogen bearing gas from a nitrogen source and an oxygen bearing gas from an oxygen source.

In some embodiments, the oxygen source may include $O_2$, $O_3$, $H_2O$, $H_2O_2$ clean dry air, among others.

In some embodiments, the nitrogen source may include $N_2$, ammonia ($NH_3$), clean dry air, $N_2O$, $N_2O$, $N_2O_2$, among others.

In some embodiments, AlON may be deposited using additional dopant hydrogen to enhance electrical insulation of the deposited-dielectric layer.

In some embodiments, the deposition of AlON may include sputtering, CVD, plasma enhanced CVD (PECVD), among others.

IMS Board Processing

Another issue is adhesion of the IMS to the subsequent metal layers to make a fully assembled IMS board. Adhesion of the subsequent metal layers to the deposited-dielectric layer may be achieved by using two methods.

The first method may form a metal composition gradient layer over a substrate. The metal composition gradient may transition from the AlON to a metal at the deposition surface for the subsequent metal layer. This metal composition gradient can range from atoms thick or up to tens of μm thick. It should be noted the metal composition gradient layer can be made of any metal or compound and also from alloys of metals or mixture of metals and compounds. This metal composition gradient layer can act as the seed layer for the subsequent metal layers to make a fully assembled IMS board.

Al may be a good metal for the gradient layer for several reasons. First, Al provides the ease of execution. In one embodiment, the Al composition gradient may be formed by reducing the levels of oxygen and nitrogen in the gradient layer during the deposition of the gradient layer. The Al gradient layer ends with an Al surface. The Al surface can then be processed with any known method i.e. metal evaporation deposition, plating method under any PH range or electro-deposition e.g. Electrolytic Plating, Physical Vapor Deposition (PVD), Chemical Vapor Deposition (CVD) and or any plasma enhanced method of above. Pretreatment of the Al can also be used with zincate or stannate among others.

In some embodiments, Cu, Ti, TiW, Sn, SnAu, Ag, Cr, V, Sc, Y, and Au are also suitable metals for the gradient layer.

The IMS for supporting an electrical or acoustical device may have enhanced adhesion. Further enhancements can be made by the addition of other elements or compounds.

Processes for forming a metal composition gradient may include sputtering, atomic layer deposition, chemical vapor deposition (CVD), plasma enhanced chemical vapor deposition (PECVD), liquid phase epitaxy, physical vapor deposition (PVD), among others for depositing a metal composition gradient layer onto a substrate. The metal composition gradient layer may be replaced with a metal-oxynitride coating or deposited-dielectric layer on to a substrate.

In an embodiment, the process includes forming an AlON layer of 10 μm thick on a Cu substrate, an Al metal composition gradient of 2 μm thick, an Al sublayer of 0.25 μm, 10 μm thick Cu substrate, electrolytic copper deposit (EC), electrolytic Ti and TiW deposition of additional seed layer, electrolytic Palladium (EPd), Immersion Gold (IG).

In an embodiment, the process includes 10 μm thick AlON on a Cu substrate, 2 μm thick Al Metal composition gradient, an Al sublayer of 0.25 μm thick, Electrochemical copper (ECu), EPd, and IG.

In an embodiment, the process includes 10 μm thick AlON on a Cu substrate, 2 μm thick Al Metal composition gradient, a Ti sublayer of 0.25 μm thick, additional seed layer (e.g. Ti, Cr, TiW among others), and ECu deposition.

In an embodiment, the process includes 1 μm thick AlON on a Cu substrate, a Ti sublayer of 0.25 μm thick, electrolytic deposition of additional seed layer (e.g. Ti, Cr, TiW among others), and ECu deposition.

In an embodiment, the process includes 1 μm thick AlON on a Cu substrate, a Cr sublayer of 0.05 μm thick, electrolytic deposition of additional seed layer (e.g. Ti, Cr, TiW among others), and ECu deposition.

In an embodiment, the process includes 10 μm thick AlON on a Cu substrate, 2 μm thick Al Metal composition gradient, an Al sublayer of 0.25 μm thick, vapor deposition copper, electrolytic deposition of additional seed layer (e.g. Ti, Cr, TiW among others), EPd, and IG.

In an embodiment, the process includes zincate/stannate treatment of the Al layer, EC 5 μm Cu, electrolytic deposition of additional seed layer (e.g. Ti, Cr, TiW among others), 10 μm electrolytic gold deposit (EG) 5 μm. The Al layer can be masked and etched to form a pattern for adhesion to the subsequent metal layers to make a fully assembled IMS board.

In an embodiment, the process includes 10 μm thick AlON on a Cu substrate, 2 μm thick Al metal composition gradient, Al mask and etch (patterning), additional seed layer (e.g. Ti, Cr, TiW among others), EC, electrolytic deposition of additional seed layer (e.g. Ti, Cr, TiW among others), EP, and IG.

In an embodiment, the process includes clean Cu substrate, lap Cu substrate, electro polish Cu substrate, 10 μm thick AlON on a Cu substrate, 2 μm thick Al metal composition gradient, Al mask and etch (patterning), electrolytic deposition of additional seed layer (e.g. Ti, Cr, TiW among others), EC, EP, and IG.

The Al layer can be combined with Cu (copper shown here for simplification but any elemental metal or metalloid can be used and is not limiting to Cu) during production of the IMS. This can be done using co-sputtering of an Al target and a Cu target (such that the ratio can be changed) or from an alloy target that has a fixed alloy composition. The layer can end up with a Cu surface or an Al/Cu surface. Further, a seed layer of Ti can also be deposited on the surface of any IMS during the production of the IMS board.

The Al layer can be a mixture of Al and metal nitride, such as Al and TIN (again TiN shown here for simplification but any elemental metal nitride or compound can be used and is not limiting to TiN, TiW, TiCr, among others). The amount of Al can be zero.

Processing for Forming Metal Rich Surface

A method is provided to produce a metal rich surface. For a metal rich surface, the additional metal can act as a mechanical bonding agent for subsequent metal layers. For example, the additional metal can be again Al, Ti, W, TiW, Au, AuSn, Cu, Sn, Ag, Cr, V, Sc, and Y. The AlON layer may become non-stoichiometric such that the Al in the AlON is metal rich, which increases the bonding to subsequent metal layers.

Another method is also provided to produce a metal rich surface. For example, the material can be made oxygen and or nitrogen deficient and perform the same function. As in the case of gradient metal layers, the metal used to create the metal rich surface may not be of the AlON film (i.e. does not have to be Al).

Other materials can be added in during or after the growth. In one example, Cu can be added to the AlON during growth. This Cu can then be masked and the Cu can be etched away leaving a preferential metal rich region. This method can also be used in the case of any metal rich surface.

An additional method is provided to make a metal rich surface. The method uses a pattern thermal processing to create Al rich surfaces. In this method, the surface is preferentially heated to decompose AlON to an Al rich surface. This decomposition can be done locally or globally with masking to suppress decomposition of masked areas in a vacuum. This decomposition can also be done with a laser.

Additionally, any method above can pattern using conventional methods known to one of those skilled in the art.

In another example, metal aluminide ($M_xAl_y$) can be formed by ether the Al metal composition gradient or the metal rich surface method.

The process for forming an IMS including a metal rich surface can include the following embodiments.

In one embodiment, the process may include: cleaning Cu substrate, lapping the Cu substrate, electro polishing the Cu substrate, forming 10 μm AlON on the Cu substrate, forming 0.25 μm Al rich AlON on AlON, seed layer, EC, additional seed layer, EP, and IG.

In one embodiment, the process may include: cleaning Cu substrate, lapping the Cu substrate, electro polishing the Cu substrate, forming 10 μm AlON on the Cu substrate, forming 0.05 μm Cu rich AlON on AlON, laser etching of 0.051 μm deep pattern, Al etching to remove excess Al from the laser etch, EC, additional seed layer, EP, and IG.

In one embodiment, the process may include: cleaning Cu substrate, lapping the Cu substrate, electro polishing the Cu substrate, forming 10 μm AlON on the Cu substrate, patterning thermal processing to create metal rich areas, EC, additional seed layer, EP, and IG.

In one embodiment, the process may include: cleaning Cu substrate, lapping the Cu substrate, electro polishing the Cu substrate, forming 10 μm AlON on the Cu substrate, laser etching of 0.051 μm deep pattern to create a recessed trace pattern with excess Al, EC, additional seed layer, EP, and IG.

In one embodiment, the process may include: cleaning Cu substrate, lapping the Cu substrate, electro polishing the Cu substrate, forming 1 μm Cu on the Cu substrate form 10 μm AlON, laser etching of 0.051 μm deep pattern to create a recessed trace pattern with excess Al, EC, additional seed layer, EP, and IG.

In one embodiment, the process may include: cleaning Cu substrate, lapping the Cu substrate, electro polishing the Cu substrate, forming 10 μm AlON on the Cu substrate, 0.05 μm, Al rich AlON on AlON, selective masking (photo or otherwise), Al etching to remove execs Al from the unmasked areas (wet or dry etch), mask removal, EC, additional seed layer, EP, and IG.

In one embodiment, a metal film on top of a core-metal-substrate with a metal-oxynitride layer such that the ratio of free metal to metal-oxynitride decreases further from the deposition surface of the subsequent metal layer to enhance stress reduction of metal-oxynitride layer on top a metal film.

In one embodiment, a ratio of free metal to metal-oxynitride increases closer to the deposition surface of the subsequent metal layer to enhance adhesion of subsequent metal layers or stress reduction of subsequent metal layers.

In one embodiment, a ratio of free metal to metal-oxynitride increases closer to the deposition surface of the subsequent metal layer to enhance adhesion of subsequent metal layers that act a stress reduction layer from plastic deformation.

For the IMS including the Al metal composition gradient or the metal rich surface, it is preferred, but not necessary, to apply/execute said methods for production without breaking vacuum.

Properties of Metal-Oxynitride Film

Thermal Conductivity and Standoff Voltage

The IMS for supporting an electrical or acoustical device includes a core-metal-substrate and a deposited-dielectric layer formed at least in part by an oxynitride, nitrogen-doped oxide or oxygen-doped nitride layer. In some embodiments, the deposited-dielectric layer has an electrical standoff voltage greater than 50 v/μm and a thermal conductivity of greater than 1 W/mK. In some embodiments, the deposited-dielectric layer may have a standoff voltage greater than 100 v/μm and a thermal conductivity of greater than 5 W/mK. In some embodiments, the deposited-dielectric layer may have a standoff voltage greater than 150 v/μm and a thermal conductivity of greater than 10 W/mK. In some embodiments, the deposited-dielectric layer may have a standoff voltage greater than 200 v/μm and a thermal conductivity of greater than 15 W/mK. In some embodiments, the deposited-dielectric layer may have a standoff voltage greater than 200 v/μm and a thermal conductivity of greater than 100 W/mK.

The deposited-dielectric layer may be thick enough to provide sufficient to adequate electrical insulation and thermal insulation. In some embodiments, the dielectric coating has a thickness ranging from 50 nm to 500 μm, preferably ranging from 1 μm to 100 μm, most preferably, from 5 μm to 20 μm.

Thermal Shock Resistance of Metal-Oxynitride Film

The IMS for supporting an electrical or acoustical device may have enhanced resistance to cracking under thermal stress or thermal cycling In one embodiment, the IMS has resistance to thermal induced cracking and delamination.

In an embodiment, a metal-oxynitride film on a substrate can be cycled from −100 to 500° C. In an embodiment, a metal-oxynitride film on a substrate can be cycled from −40 to 160° C. In an embodiment, a metal-oxynitride film on a substrate can be cycled from 0 to 100° C. In an embodiment, a metal-oxynitride film on a substrate can be cycled from −40 to 700° C. In an embodiment, a metal-oxynitride film on a substrate can be cycled from 20 to 500° C.

In one embodiment, the IMS withstands thermal cycling greater than 5° C. per min from 25 to 200° C.

In an embodiment, the IMS including a metal-oxynitride layer may have a resistance to thermal cracking after thermal cycling to 500° C. In an embodiment, the IMS may have a resistance to thermal cracking after thermal cycling to 400° C. In an embodiment, the IMS may have a resistance to thermal cracking after thermal cycling to 300° C. In an embodiment, the IMS may have a resistance to thermal cycling at 200° C. In an embodiment, the IMS may have a resistance to thermal cracking after thermal cycling to 100° C.

In one embodiment, the IMS including a metal-oxynitride layer has lower thermal resistance than $Al_2O_3$.

In one embodiment, the IMS has low to no-free metal in the film.

In one embodiment, the IMS has percent porosity lower than 10%.

Examples

Figure 11:
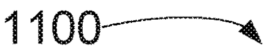
FIG. 11 is an optical image of a three-dimensional shaped AlON on a core-metal-substrate according to an embodiment.
Figure 11:
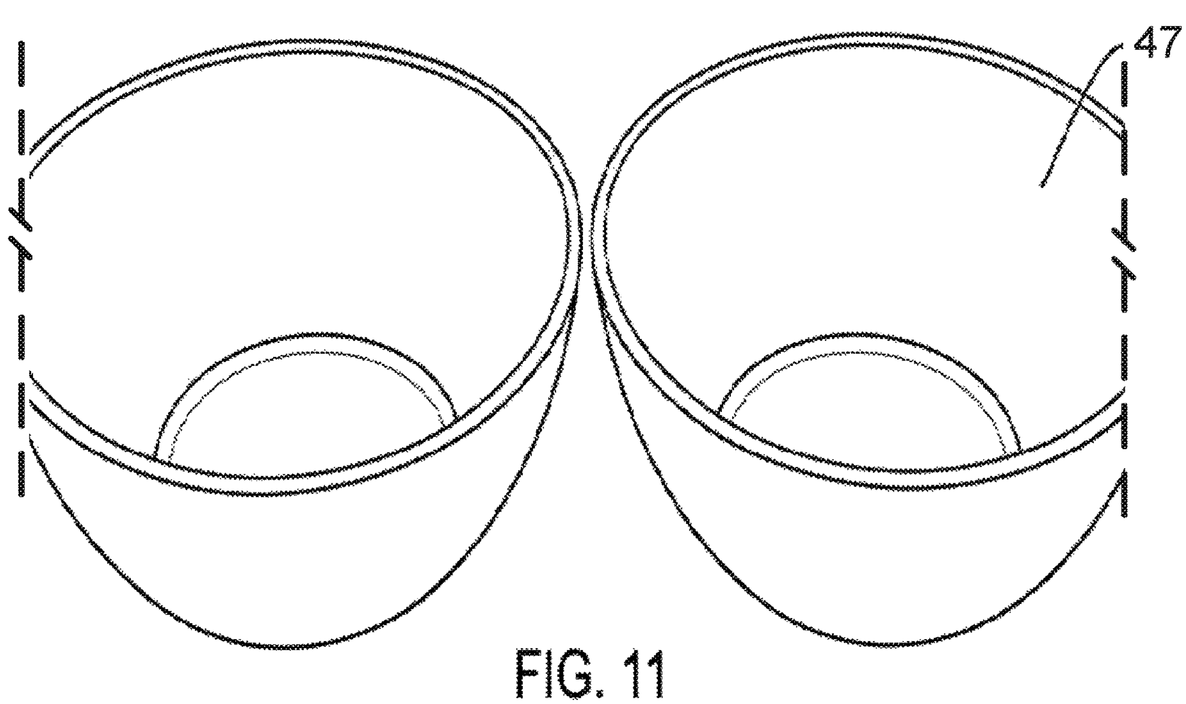

FIG. 11 is an optical image of a three-dimensional shaped AlON on a core-metal-substrate according to an embodiment. As shown in FIG. 11, AlON is deposited in entire coverage of a 3D substrate by using the above method.

Figure 12:
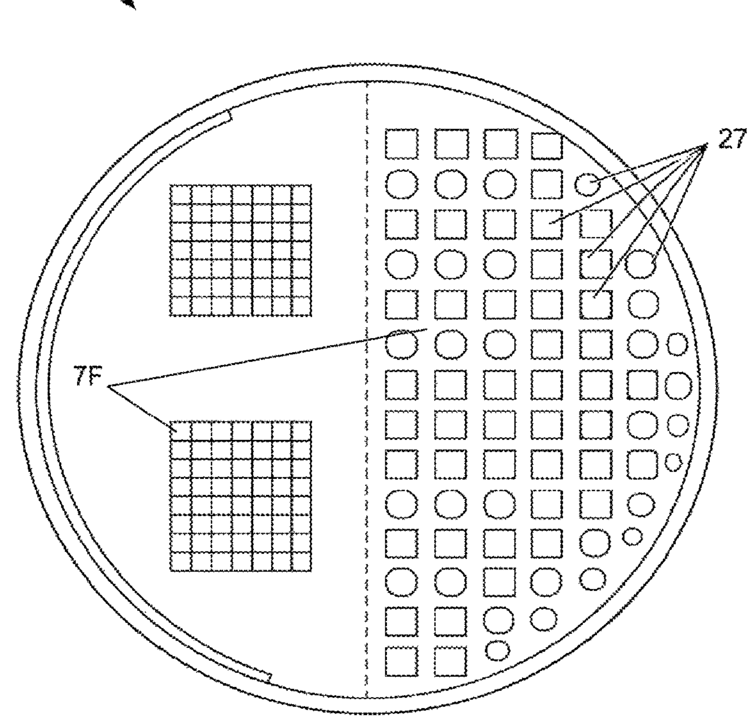
FIG. 12 is an optical image of a dielectric layer over a Cu substrate according to an embodiment.

In some embodiments, the AlON layer can be masked to reduce the total covered area resulting in less over all stress strain forces. FIG. 12 is an optical image of a dielectric layer over a Cu substrate according to an embodiment. As shown in FIG. 12, an IMS 1200 includes patterned Al metal layer 27 in circles or squares and $Al_xO_yN_z$ dielectric layer 7F, which is between the patterned circles or squares and also on the left half-circle. The IMS is formed by the above method.

Figure 13:
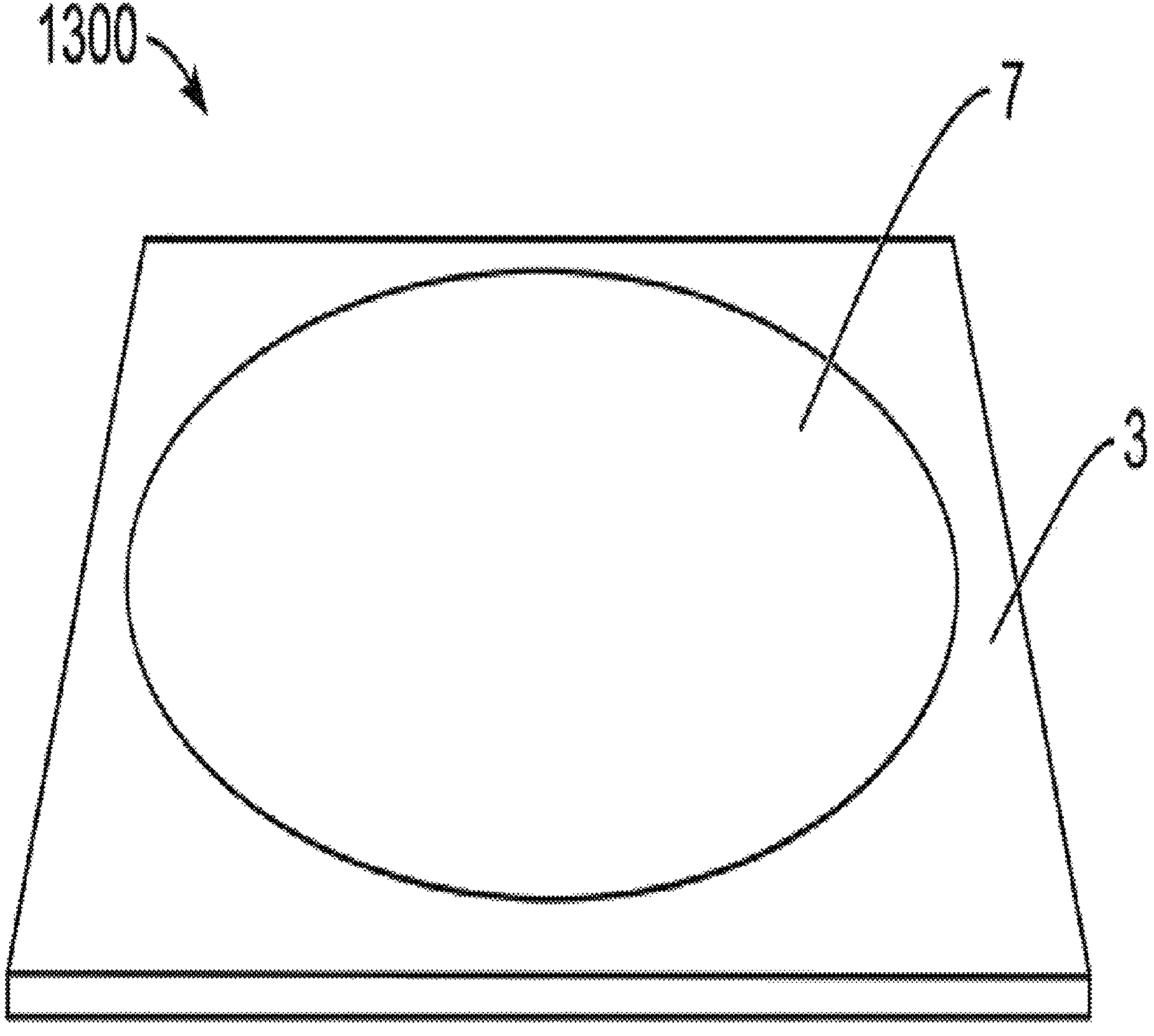
FIG. 13 is an optical image of an AlON on a Cu substrate according to an embodiment.

FIG. 13 is an optical image of an AlON on a Cu substrate according to an embodiment. As shown in FIG. 13, an IMS 1300 includes a deposited-dielectric layer AlON 7 and a Cu substrate 3. The AlON is formed by the above method.

For an IMS having an AlON film of 3.32 μm thick on an AlSi substrate, the breakdown voltage is 1500 volts.

Having described several embodiments, it will be recognized by those skilled in the art that various modifications, alternative constructions, and equivalents may be used without departing from the spirit of the disclosure. Additionally, a number of well-known processes and elements have not been described in order to avoid unnecessarily obscuring the embodiments disclosed herein. Accordingly, the above description should not be taken as limiting the scope of the document.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall there between.

What is claimed is:

1. A method for forming an insulated metal substrate with a metal rich surface, the method comprising:
cleaning a copper (Cu) substrate;
lapping the Cu substrate;
electropolishing the Cu substrate;
forming a 10 μm aluminum oxynitride (AlON) layer on the Cu substrate;
forming a 0.05 μm Cu rich AlON layer on the 10 μm AlON layer;
laser etching a 0.05 μm deep pattern; and
etching to remove excess Al.

2. The method of claim 1, the method further comprising:
electrolytically depositing a Cu layer;
depositing an additional seed layer;
electrolytically depositing a palladium layer; and
applying an immersion gold layer.

3. The method of claim 2, further comprising electrolytically depositing a Cu layer;
depositing an additional seed layer; electrolytically depositing a palladium layer; and applying an immersion gold layer.

4. The method of claim 1, the aluminum oxynitride dielectric layer has a thickness between 5 μm and 50 μm on the copper substrate.

5. The method of claim 1, wherein the insulated metal substrate produced by the method exhibits a breakdown strength greater than 50 V/μm.

6. The method of claim 1, wherein the aluminum oxynitride layer formed on the Cu substrate has a thickness between 5 μm and 20 μm.

7. The method of claim 1, wherein the aluminum oxynitride layer formed on the Cu substrate has a thickness between 1 μm and 100 μm.

8. The method of claim 1, wherein the aluminum oxynitride layer is configured to provide electrical isolation while maintaining thermal conduction across the substrate.

9. The method of claim 1, wherein the Cu rich ALON layer has a thickness up to 0.05 μm.

10. The method of claim 1, wherein the copper-rich aluminum oxynitride layer transition from a region devoid of copper to at least one region comprising copper.

11. The method of claim 1, wherein the insulated metal substrate has a compositionally graded interface extending from an aluminum oxynitride layer to a copper region, the interface comprising a copper-rich aluminum oxynitride region.

12. The method of claim 1, wherein copper concentration increases across a thickness from the aluminum oxynitride layer toward the copper substrate.

13. The method of claim 1, wherein the copper-rich aluminum oxynitride layer adjoins a metallic copper region.

14. The method of claim 1, wherein laser etching removes material without etching through the entire thickness of the layer.

15. The method of claim 1, wherein laser etching is performed on selected regions of the aluminum oxynitride layer to define a pattern.

16. The method of claim 1, wherein etching reduces aluminum concentration without completely removing aluminum from the copper-rich aluminum oxynitride layer.

17. The method of claim 1, further comprising depositing a copper layer and a palladium layer by an electroless deposition process.

18. The method of claim 1, further comprising depositing a copper layer by electroless deposition, depositing a palladium layer by electroless deposition, and applying an immersion gold layer.

19. The method of claim 1, further comprising depositing at least one of a copper layer or a palladium layer by an electroless deposition process.

20. The method of claim 1, wherein the copper layer is deposited by one of electrolytic deposition or electroless deposition.

21. The method of claim 1, wherein the laser etching defines a patterned structure comprising electrically isolated regions.

22. The method of claim 1, wherein the laser etching selectively removes material from discrete regions of the aluminum oxynitride layer.

23. The method of claim 1, further comprising chemically etching the aluminum oxynitride layer.

24. The method of claim 1, etching to remove excess Al comprises by chemical etching to further define patterned regions.

25. The method of claim 1, wherein etching to remove excess Al comprises chemical etching.

26. The method of claim 1, wherein the patterned structure defines conductive features within the insulated metal substrate.

27. The method of claim 1, further comprising etching a subsequently deposited metal layer.

28. The method of claim 1, wherein patterned metallization features are formed on the insulated metal substrate.

29. A method for forming an insulated metal substrate with a metal rich surface, the method comprising:
cleaning a copper (Cu) substrate;
lapping the Cu substrate;
electropolishing the Cu substrate;
forming an aluminum oxynitride (AlON) layer of less than 200 μm on the Cu substrate; and,
forming a Cu rich AlON layer on the AlON layer.

30. The method of claim 29 further comprising:
laser etching a pattern having a depth of at least 0.05 μm; and
etching to remove excess Al.

* * * * *